United States Patent
Chen et al.

(10) Patent No.: US 12,477,724 B2
(45) Date of Patent: Nov. 18, 2025

(54) ANTIFUSE-TYPE ONE TIME PROGRAMMING MEMORY CELL WITH GATE-ALL-AROUND TRANSISTOR

(71) Applicant: eMemory Technology Inc., Hsin-chu (TW)

(72) Inventors: Lun-Chun Chen, Hsinchu County (TW); Ping-Lung Ho, Hsinchu County (TW); Chun-Hung Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 508 days.

(21) Appl. No.: 18/120,731

(22) Filed: Mar. 13, 2023

(65) Prior Publication Data

US 2023/0371249 A1    Nov. 16, 2023

Related U.S. Application Data

(60) Provisional application No. 63/340,980, filed on May 12, 2022.

(51) Int. Cl.
*H10B 20/25*    (2023.01)

(52) U.S. Cl.
CPC .................... *H10B 20/25* (2023.02)

(58) Field of Classification Search
None
See application file for complete search history.

(56) References Cited

U.S. PATENT DOCUMENTS

| | | |
|---|---|---|
| 8,305,790 B2 | 11/2012 | Chung |
| 9,620,176 B2 | 4/2017 | Wu |
| 9,634,015 B2* | 4/2017 | Wong ..................... H10D 89/10 |
| 10,586,832 B2 | 3/2020 | Chung |
| 2015/0333078 A1* | 11/2015 | Colinge ............... H10D 64/518 |
| | | 438/257 |
| 2021/0249422 A1* | 8/2021 | Chang ................. G06F 30/392 |
| 2022/0359545 A1* | 11/2022 | Chang ................. H10D 64/017 |
| 2023/0064751 A1* | 3/2023 | Chang ................ H01L 23/5252 |
| 2023/0328978 A1* | 10/2023 | Sun ....................... G11C 16/14 |

\* cited by examiner

*Primary Examiner* — Alexander G Ghyka
(74) *Attorney, Agent, or Firm* — WPAT, PC

(57) ABSTRACT

An antifuse-type one time programming memory cell at least includes an antifuse transistor. The antifuse transistor includes a first nanowire, a first gate structure, a first drain/source structure and a second drain/source structure. The first nanowire is surrounded by the first gate structure. The first gate structure comprises a first spacer, a second spacer, a first gate dielectric layer and a first gate layer. The first drain/source structure is electrically contacted with a first terminal of the first nanowire. The second drain/source structure is electrically contacted with a second terminal of the first nanowire.

25 Claims, 9 Drawing Sheets

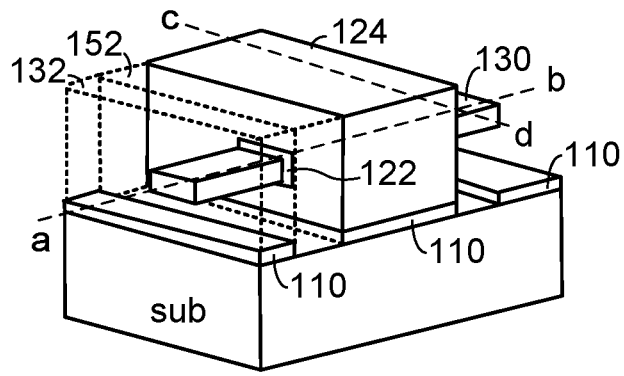
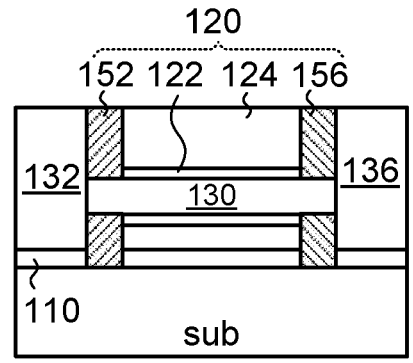
FIG. 1A     FIG. 1B
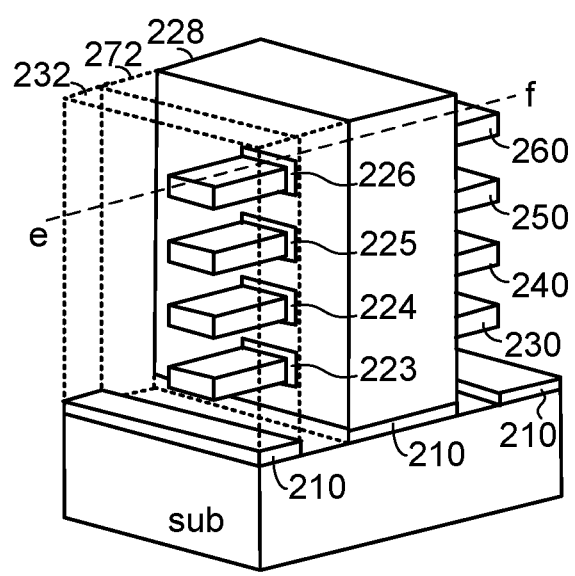
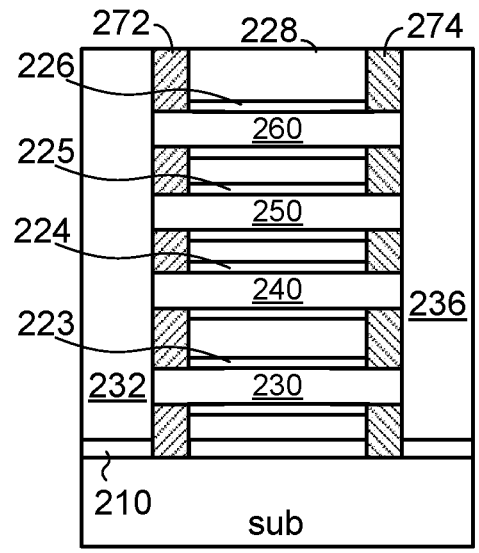
FIG. 2A     FIG. 2B
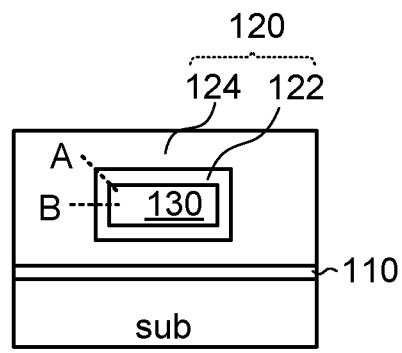
FIG. 3

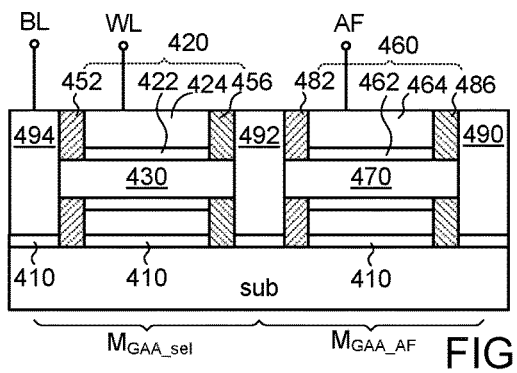 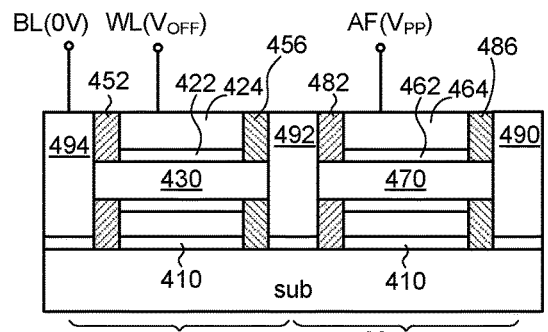
FIG. 4    FIG. 5B
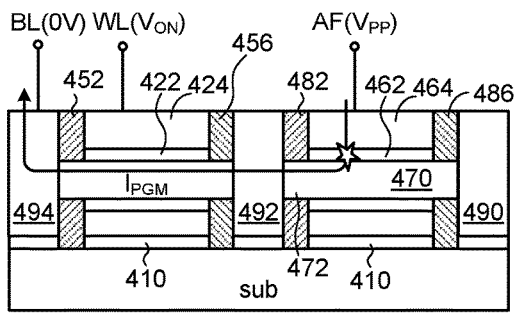 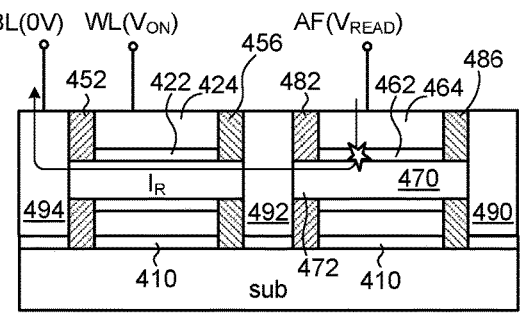
FIG. 5A    FIG. 5C

ANTIFUSE-TYPE ONE TIME PROGRAMMING MEMORY CELL WITH GATE-ALL-AROUND TRANSISTOR This application claims the benefit of U.S. provisional application Ser. No. 63/340,980, filed May 12, 2022, the subject matters of which are incorporated herein by references.

FIELD OF THE INVENTION

The present invention relates to a memory cell of a non-volatile memory, and more particularly to an antifuse-type one time programming memory cell with a gate-all-around (GAA) transistor.

BACKGROUND OF THE INVENTION

As is well known, non-volatile memories may be classified into a multi-time programming memory (also referred as a MTP memory), a one time programming memory (also referred as an OTP memory) and a mask read only memory (also referred as a Mask ROM). Generally, the MTP memory can be programmed many times, and the stored data of the MTP memory can be modified many times. In contrast, the OTP memory can be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

For example, before the memory cell of an antifuse-type OTP memory is programmed, the memory cell of the antifuse-type OTP memory is in a high-resistance storage state. After the memory cell of the antifuse-type OTP memory is programmed, the memory cell of the antifuse-type OTP memory is in a low-resistance storage state. After the memory cell of an antifuse-type OTP memory is programmed, the stored data cannot be changed.

With the continuous evolution of semiconductor manufacturing processes, transistors have been gradually developed from the early planar transistors to fin field-effect transistors (Fin-FETs). In a more advanced process, a gate-all-around (GAA) transistor has been produced. The size of the GAA transistor is smaller. Moreover, a channel region of the GAA transistor is surrounded by a gate electrode of the GAA transistor. As known, the GAA transistor has good gate control capability and low source/drain leakage current. As a consequently, traditional transistors are gradually replaced by the GAA transistors.

SUMMARY OF THE INVENTION

An embodiment of the present invention provides an antifuse-type one time programming memory cell. The antifuse-type one time programming memory cell includes: a semiconductor substrate; an isolation layer formed on a surface of the semiconductor substrate; a first nanowire; a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate; a first drain/source structure formed over the isolation layer and electrically contacted with a first terminal of the first nanowire; a second drain/source structure formed over the isolation layer and electrically contacted with a second terminal of the first nanowire; wherein the first nanowire, the first gate structure, the first drain/source structure and the second drain/source structure are collaboratively formed as a first select transistor; a second nanowire, wherein a first terminal of the second nanowire is electrically contacted with the second drain/source structure; a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate; and a third drain/source structure formed over the isolation layer and electrically contacted with a second terminal of the second nanowire; wherein the second nanowire, the second gate structure, the second drain/source structure and the third drain/source structure are collaboratively formed as an antifuse transistor; wherein each of the first select transistor and the antifuse transistor is a gate-all-around transistor, the first drain/source structure is connected with a bit line, the first gate layer of the first gate structure is connected with a word line, and the second gate layer of the second gate structure is connected with an antifuse control line.

Another embodiment of the present invention provides an antifuse-type one time programming memory cell. The antifuse-type one time programming memory cell includes: a semiconductor substrate; an isolation layer formed on a surface of the semiconductor substrate; a first nanowire; a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate; a first drain/source structure formed over the isolation layer and electrically contacted with a first terminal of the first nanowire; a second drain/source structure formed over the isolation layer and electrically contacted with a second terminal of the first nanowire; wherein the first nanowire, the first gate structure, the first drain/source structure and the second drain/source structure are collaboratively formed as a first select transistor; a second nanowire, wherein a first terminal of the second nanowire is electrically contacted with the second drain/source structure; a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate; a third drain/source structure formed over the isolation layer and electrically contacted with a second terminal of the second nanowire; wherein the second nanowire, the second gate structure, the second drain/source structure and the third drain/source structure are collaboratively formed as a first following transistor; a third nanowire, wherein a first terminal of the third nanowire is electrically contacted with the third drain/source structure; a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is located over the isolation layer, a first side region of the third nanowire is surrounded by the fifth spacer, a second side region of the third nanowire is surrounded by the sixth spacer, and the fifth spacer and the sixth spacer are located over the semiconductor substrate; and a fourth drain/source structure formed over the isolation layer and electrically contacted with a second terminal of the third nanowire; wherein the third nanowire, the third gate structure, the third drain/source structure and the fourth drain/source structure are collaboratively formed as an antifuse transistor; wherein each of the first select transistor, the first following transistor and the antifuse transistor is a gate-all-around transistor, the first drain/source structure is connected with a bit line, the first gate layer of the first gate structure is connected with a word line, the second gate layer of the second gate structure is connected with a following line, and the third gate layer of the third gate structure is connected with an antifuse control line.

Another embodiment of the present invention provides an antifuse-type one time programming memory cell. The antifuse-type one time programming memory cell includes: a semiconductor substrate; an isolation layer formed on a surface of the semiconductor substrate; a first nanowire; a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate; a first drain/source structure formed over the isolation layer and electrically contacted with a first terminal of the first nanowire; a second drain/source structure formed over the isolation layer and electrically contacted with a second terminal of the first nanowire; wherein the first nanowire, the first gate structure, the first drain/source structure and the second drain/source structure are collaboratively formed as a first transistor; a second nanowire, wherein a first terminal of the second nanowire is electrically contacted with the second drain/source structure; a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate; a third drain/source structure formed over the isolation layer and electrically contacted with a second terminal of the second nanowire; wherein the second nanowire, the second gate structure, the second drain/source structure and the third drain/source structure are collaboratively formed as a second transistor; a third nanowire, wherein a first terminal of the third nanowire is electrically contacted with the third drain/source structure; a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is located over the isolation layer, a first side region of the third nanowire is surrounded by the fifth spacer, a second side region of the third nanowire is surrounded by the sixth spacer, and the fifth spacer and the sixth spacer are located over the semiconductor substrate; and a fourth drain/source structure formed over the isolation layer and electrically contacted with a second terminal of the third nanowire; wherein the third nanowire, the third gate structure, the third drain/source structure and the fourth drain/source structure are collaboratively formed as a third transistor; a fourth nanowire, wherein a first terminal of the fourth nanowire is electrically contacted with the fourth drain/source structure; a fourth gate structure comprising a seventh spacer, an eighth spacer, a fourth gate dielectric layer and a fourth gate layer, wherein a central region of the fourth nanowire is surrounded by the fourth gate dielectric layer, the fourth gate dielectric layer is surrounded by the fourth gate layer, the fourth gate layer is located over the isolation layer, a first side region of the fourth nanowire is surrounded by the seventh spacer, a second side region of the fourth nanowire is surrounded by the eighth spacer, and the seventh spacer and the eighth spacer are located over the semiconductor substrate; and a fifth drain/source structure formed over the isolation layer and electrically contacted with a second terminal of the fourth nanowire; wherein the fourth nanowire, the fourth gate structure, the fourth drain/source structure and the fifth drain/source structure are collaboratively formed as an antifuse transistor; wherein each of the first transistor, the second transistor, the third transistor and the antifuse transistor is a gate-all-around transistor.

Another embodiment of the present invention provides an antifuse-type one time programming memory cell. The antifuse-type one time programming memory cell includes: a semiconductor substrate; an isolation layer formed on a surface of the semiconductor substrate; a first nanowire; a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate; a first drain/source structure formed over the isolation layer and electrically contacted with a first terminal of the first nanowire; a second drain/source structure formed over the isolation layer and electrically contacted with a second terminal of the first nanowire; wherein the first nanowire, the first gate structure, the first drain/source structure and the second drain/source structure are collaboratively formed as an antifuse select transistor; wherein the antifuse transistor is a storage element of the antifuse-type one time programming memory cell, and the antifuse transistor is a gate-all-around transistor; wherein when a program action is performed, the first gate dielectric layer is ruptured, so that the antifuse-type one time programming memory cell is programmed to a low-resistance storage state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A is a schematic perspective view illustrating the structure of a GAA transistor according to an embodiment of the present invention;

FIG. 1B is a schematic cross-sectional view illustrating the GAA transistor as shown in FIG. 1A and taken along the line a-b;

FIG. 2A is a schematic perspective view illustrating the structure of a GAA transistor according to another embodiment of the present invention;

FIG. 2B is a schematic cross-sectional view illustrating the GAA transistor as shown in FIG. 2A and taken along the line e-f;

FIG. 3 is a schematic cross-sectional view illustrating the GAA transistor as shown in FIG. 1A and taken along the line c-d;

FIG. 4 is a schematic cross-sectional view illustrating the structure of an antifuse-type one time programming memory cell according to a first embodiment of the present invention;

FIG. 5A schematically illustrates associated bias voltages for performing a program action on the memory cell according to the first embodiment of the present invention;

FIG. 5B schematically illustrates associated bias voltages for performing a program inhibition action on the memory cell according to the first embodiment of the present invention;

FIG. 5C schematically illustrates associated bias voltages for performing a read action on the memory cell according to the first embodiment of the present invention;

DETAILED DESCRIPTION OF PREFERRED EMBODIMENTS

Figure 6A:
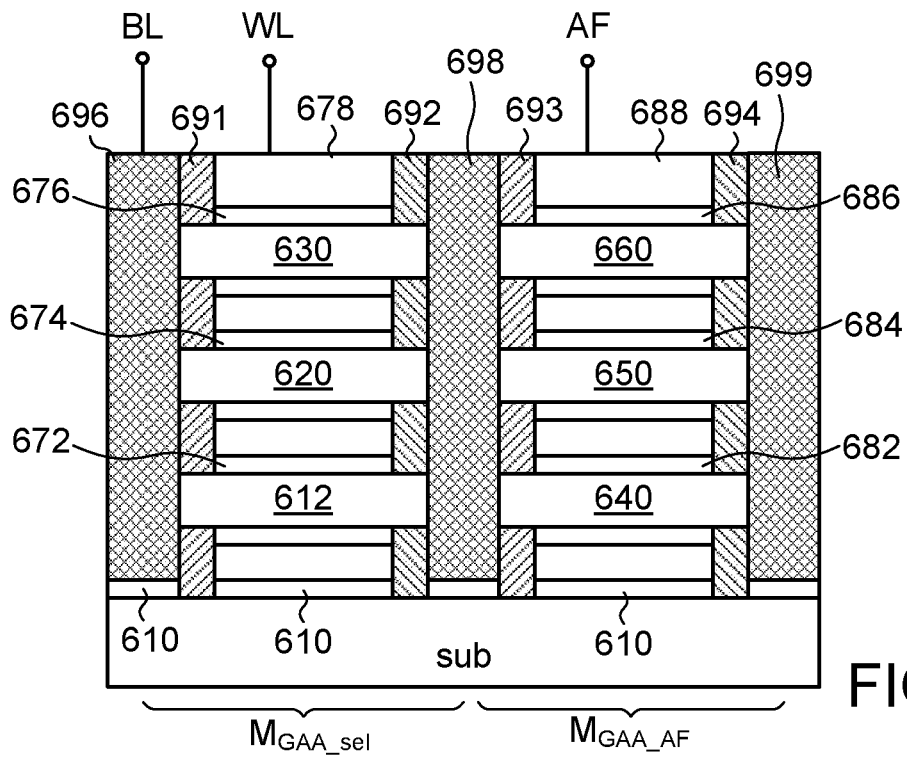
FIG. 6A is a schematic cross-sectional view illustrating the structure of an antifuse-type one time programming memory cell according to a second embodiment of the present invention.

FIG. 1A is a schematic perspective view illustrating the structure of a GAA transistor according to an embodiment of the present invention. FIG. 1B is a schematic cross-sectional view illustrating the GAA transistor as shown in FIG. 1A and taken along the line a-b.

As shown in FIG. 1A and FIG. 1B, an isolation layer 110 is formed on a surface of a semiconductor substrate sub. A gate structure 120 is formed above the semiconductor substrate sub. A nanowire 130 is penetrated through the gate structure 120. That is, the nanowire 130 is surrounded and supported by the gate structure 120. For example, the nanowire 130 is a rectangular nanowire or a cylindrical nanowire. Furthermore, two drain/source structures 132 and 136 are electrically contacted with the nanowire 130. In some embodiments, the nanowire 130 can be penetrated through two drain/source structures 132 and 136 or the nanowire 130 can be contacted with the surface of the two drain/source structures 132 and 136. According to the embodiment of the invention, the two drain/source structures 132 and 136, the gate structure 120 and nanowire 130 are collaboratively formed as a GAA transistor.

As shown in FIG. 1B, the gate structure 120 comprises spacers 152 and 156, a gate dielectric layer 122 and a gate layer 124. The gate dielectric layer 122 surrounds the central region of the nanowire 130. The gate layer 124 surrounds the gate dielectric layer 122. The gate layer 124 is formed on the isolation layer 110. The first side region of the nanowire 130 is surrounded by the spacer 152, the second side of the nanowire 130 is surrounded by the spacer 156, and the spacers 152 and 156 are formed on the semiconductor substrate sub. The nanowire 130 that is surrounded by the gate structure 120 is a nanowire channel region of a GAA transistor. Furthermore, two drain/source structures 132 and 136 are formed above the isolation layer 110, and located on both sides of the gate structure 120. The drain/source structure 132 is electrically contacted with a first terminal of the nanowire 130, and the drain/source structure 136 is electrically contacted with a second terminal of the nanowire 130. The spacer 152 is contacted with nanowire 130 and drain/source structure 132, and the spacer 156 is contacted with nanowire 130 and drain/source structure 136. In an embodiment, the drain/source structure 132, the drain/source structure 136 and the nanowire 130 may have the same dopant type, which a junctionless type antifuse cell is formed. For example, the drain/source structure 132, the drain/source structure 136 and the nanowire 130 are n-type doped regions or p-type doped regions.

As shown in FIG. 1B, the GAA transistor includes the gate structure 120, the nanowire 130, the drain/source structure 132 and the drain/source structure 136. The nanowire 130 serves as the nanowire channel region of the GAA transistor.

It is noted that the number of nanowires in the GAA transistor is not restricted. For example, in another embodiment, the GAA transistor comprises plural nanowires. FIG. 2A is a schematic perspective view illustrating the structure of a GAA transistor according to another embodiment of the present invention. FIG. 2B is a schematic cross-sectional view illustrating the GAA transistor as shown in FIG. 2A and taken along the line e-f.

As shown in FIG. 2A and FIG. 2B, an isolation layer 210 is formed on a surface of a semiconductor substrate sub. A gate structure is formed above the isolation layer 210, and plural nanowires 230, 240, 250 and 260 are penetrated through the gate structure. That is, the nanowires 230, 240, 250 and 260 are surrounded and supported by the gate structure. For example, the nanowires 230, 240, 250 and 260 are rectangular nanowires or cylindrical nanowires. Furthermore, two drain/source structures 232 and 236 are electrically contacted with the nanowires 230, 240, 250 and 260. According to the embodiment of the invention, the two drain/source structures 232 and 236, the gate structure and nanowires 230, 240, 250 and 260 are collaboratively formed as a GAA transistor.

As shown in FIG. 2B, the gate structure comprises spacers 272 and 274, gate dielectric layers 223, 224, 225 and 226 and a gate layer 228. The gate dielectric layer 223 surrounds the central region of the nanowire 230. The gate dielectric layer 224 surrounds the central region of the nanowire 240. The gate dielectric layer 225 surrounds the central region of the nanowire 250. The gate dielectric layer 226 surrounds the central region of the nanowire 260. Moreover, the gate layer 228 surrounds the gate dielectric layers 223, 224, 225 and 226. The gate layer 228 is formed on the isolation layer 210. The first side regions of the nanowires 230, 240, 250 and 260 are surrounded by the spacer 272, and the second side regions of the nanowires 230, 240, 250 and 260 are surrounded by the spacer 274, and the spacers 272 and 274 are formed on the semiconductor substrate sub. The nanowires 230, 240, 250 and 260 that are surrounded by the gate structure are nanowire channel regions of the GAA transistor. Furthermore, two drain/source structures 232 and 236 are formed above the isolation layer 210, and located on both sides of the gate structure. The drain/source structure 232 is electrically contacted with the first terminals of the nanowires 230, 240, 250 and 260, and the drain/source structure 236 is electrically contacted with the second terminals of the nanowires 230, 240, 250 and 260. The spacer 272 is contacted with the nanowires 230, 240, 250 and 260 and drain/source structure 232, and the spacer 274 is contacted with the nanowires 230, 240, 250 and 260 and drain/source structure 236. In an embodiment, the drain/source structure 232, the drain/source structure 236 and the nanowires 230, 240, 250 and 260 may have the same dopant type. For example, the drain/source structure 232, the drain/source structure 236 and the nanowires 230, 240, 250 and 260 are n-type doped regions or p-type doped regions.

As shown in FIG. 2B, the GAA transistor includes the gate structure, the nanowires 230, 240, 250 and 260, the drain/source structure 232 and the drain/source structure 236. The nanowires 230, 240, 250 and 260 serve as the nanowire channel regions of the GAA transistor.

The GAA transistor as shown in FIG. 2A comprises four nanowires 230, 240, 250 and 260. It is noted that the number of the nanowires in the GAA transistor is not restricted. Moreover, the nanowires 130, 230, 240, 250 and 260 as shown in FIGS. 1A and 1B can also be referred as nanosheets.

FIG. 3 is a schematic cross-sectional view illustrating the GAA transistor as shown in FIG. 1A and taken along the line c-d. As shown in FIG. 3, the nanowire is a rectangular nanowire. The gate structure 120 is located over the isolation layer 110, which is formed on the surface of a semiconductor substrate sub. The nanowire channel region of the nanowire 130 is surrounded by the gate structure 120. The thickness of the gate dielectric layer 122 is about 0.02 μm. For example, in a case that a voltage difference between the gate layer 124 and the nanowire 130 is 6V, and the electric field (E) at the positions near the flat surface B of the gate dielectric layer 122 is uniformly distributed (e.g., about 10 MV/cm). Moreover, as the depth of the gate dielectric layer 122 increases, the electric field (E) at the positions near the corner region A of the gate dielectric layer 122 gradually increases. Moreover, the electric field (E) at the junction between the gate dielectric layer 122 and the nanowire 130 is the largest (e.g., 19 MV/cm). That is, if there is a specified high voltage difference between the gate dielectric layer 122 and the nanowire 130, the electric field (E) at the junction between the gate dielectric layer 122 and the nanowire 130 is the largest. As a consequence, the gate dielectric layer 122 is ruptured at the corner region A. Due to the above characteristics, a novel antifuse-type one time programming memory cell with the GAA transistor can be designed.

That is, the GAA transistor as shown in FIG. 1B or FIG. 2B can be used as a storage element of the antifuse-type one time programming memory cell. This storage element is also referred as an antifuse transistor.

FIG. 4 is a schematic cross-sectional view illustrating the structure of an antifuse-type one time programming memory cell according to a first embodiment of the present invention. In this embodiment, the memory cell comprises two GAA transistors. The two GAA transistors include a select transistor $M_{GAA\_sel}$ and an antifuse transistor $M_{GAA\_AF}$. The select transistor $M_{GAA\_sel}$ and the antifuse transistor $M_{GAA\_AF}$ are formed over the semiconductor substrate sub. The three-dimensional structure of each of the select transistor $M_{GAA\_sel}$ and the antifuse transistor $M_{GAA\_AF}$ is similar to that of FIG. 1A, and not redundantly described herein.

The select transistor $M_{GAA\_sel}$ comprises a drain/source structure 492, a drain/source structure 494, a gate structure 420 and a nanowire 430. The gate structure 420 is formed above the semiconductor sub. The gate structure 420 comprises two spacers 452 and 456, a gate dielectric layer 422 and a gate layer 424. The gate dielectric layer 422 surrounds the central region of the nanowire 430. The gate layer 424 surrounds the gate dielectric layer 422. The gate layer 424 is formed on the isolation layer 410. The first side region of the nanowire 430 is surrounded by the spacer 452, the second side region of the nanowire 430 is surrounded by the spacer 456, and the spacers 452 and 456 are formed on the semiconductor substrate sub. The nanowire 430 that is surrounded by the gate structure 420 is a nanowire channel region of the select transistor $M_{GAA\_sel}$. Furthermore, two drain/source structures 492 and 494 are formed above the isolation layer 410, and located on both sides of the gate structure 420. The drain/source structure 494 is electrically contacted with a first terminal of the nanowire 430, and the drain/source structure 492 is electrically contacted with a second terminal of the nanowire 430.

The antifuse transistor $M_{GAA\_AF}$ comprises the drain/source structure 492, a drain/source structure 490, a gate structure 460 and a nanowire 470. The gate structure 460 is formed above the semiconductor sub. The gate structure 460 comprises spacers 482 and 486, a gate dielectric layer 462 and a gate layer 464. The gate dielectric layer 462 surrounds the central region of the nanowire 470. The gate layer 464 surrounds the gate dielectric layer 462. The gate layer 462 is formed on the isolation layer 410. The first side region of the nanowire 470 is surrounded by the spacer 482, the second side region of the nanowire 470 is surrounded by the spacer 486, and the spacers 482 and 486 are formed on the semiconductor substrate sub. The nanowire 470 that is surrounded by the gate structure 460 is a nanowire channel region of the antifuse transistor $M_{GAA\_AF}$. Furthermore, two drain/source structures 492 and 490 are formed above the isolation layer 410, and located on both sides of the gate structure 460. The drain/source structure 492 is electrically contacted with a first terminal of the nanowire 470, and the drain/source structure 490 is electrically contacted with a second terminal of the nanowire 470.

According to a first embodiment of the present invention, the drain/source structure 492 is shared by the select transistor $M_{GAA\_sel}$ and the antifuse transistor $M_{GAA\_AF}$. Furthermore, the drain/source structures 490, 492 and 494, and the nanowires 430 and 470 in the antifuse-type one time programming memory cell may have the same dopant type. For example, the drain/source structures 490, 492 and 494, and the nanowires 430 and 470 are n-type doped regions or p-type doped regions.

In the memory cell of the first embodiment, the drain/source structure 494 is connected with a bit line BL, the gate layer 424 of the select transistor $M_{GAA\_sel}$ is connected with a word line WL, and the gate layer 464 of the antifuse transistor $M_{GAA\_AF}$ is connected with an antifuse control line AF. For example, the nanowires 430 and 470 in the memory cell are rectangular nanowires or cylindrical nanowires.

FIG. 5A schematically illustrates associated bias voltages for performing a program action on the memory cell according to the first embodiment of the present invention. FIG. 5B schematically illustrates associated bias voltages for performing a program inhibition action on the memory cell according to the first embodiment of the present invention. FIG. 5C schematically illustrates associated bias voltages for performing a read action on the memory cell according to the first embodiment of the present invention.

Please refer to FIG. 5A. When the program action is performed, the antifuse control line AF receives a program voltage $V_{PP}$, the bit line BL receives a ground voltage (0V), and the word line WL receives an on voltage $V_{ON}$. For example, the program voltage $V_{PP}$ is in the range between 3V and 6V, and the on voltage $V_{ON}$ is in the range between 0.4V and 3V.

When the program action is performed, the select transistor $M_{GAA\_sel}$ of the memory cell is turned on. Consequently, the ground voltage (0V) of the bit line BL is transmitted to the drain/source structure 492 of the antifuse transistor $M_{GAA\_AF}$ through the nanowire 430 of the select transistor $M_{GAA\_sel}$. When the antifuse control line AF receives the program voltage $V_{PP}$, the voltage stress between the nanowire 470 and the gate layer 464 of the antifuse transistor $M_{GAA\_AF}$ is equal to the program voltage $V_{PP}$. Under this circumstance, the gate dielectric layer 462 of the antifuse transistor $M_{GAA\_AF}$ is ruptured. Consequently, the memory cell generates a program current $I_{PGM}$. The program current $I_{PGM}$ flows from the antifuse control line AF to the bit line BL. Consequently, the region between the gate layer 464 and the drain/source structure 492 of the antifuse transistor $M_{GAA\_AF}$ has a low resistance value. That is, the memory cell is programmed to a low-resistance storage state.

Please refer to FIG. 5B. When the program inhibition action is performed, the antifuse control line AF receives the program voltage $V_{PP}$, the bit line BL receives the ground voltage (0V), and the word line WL receives an off voltage VOFF. When the program inhibition action is performed, the select transistor $M_{GAA\_sel}$ of the memory cell is turned off. Consequently, the ground voltage (0V) of the bit line BL cannot be transmitted to the drain/source structure 492 of the antifuse transistor $M_{GAA\_AF}$. When the antifuse control line AF receives the program voltage $V_{PP}$, the voltage stress between the gate layer 464 and nanowire 470 of the antifuse transistor $M_{GAA\_AF}$ is very low. Under this circumstance, the program current is not generated, and the gate dielectric layer 462 of the antifuse transistor $M_{GAA\_AF}$ is not ruptured. Consequently, the region between the gate layer 464 and the drain/source structure 492 of the antifuse transistor $M_{GAA\_AF}$ is maintained in a high resistance value. That is, the memory cell is maintained in a high-resistance storage state.

In another embodiment, when the program inhibition action is performed, the antifuse control line AF is in a floating state. Consequently, regardless of whether the select transistor $M_{GAA\_sel}$ is turned on or turned off, the gate dielectric layer 462 of the antifuse transistor $M_{GAA\_AF}$ is not ruptured. That is, the memory cell is maintained in the high-resistance storage state. Or, when the program inhibition action is performed, the bit line BL receives a voltage equals to the on voltage $V_{ON}$. Consequently, the memory cell is also maintained in the high-resistance storage state.

Please refer to FIG. 5C. When the read action is performed, the antifuse control line AF receives a read voltage VREAD, the bit line BL receives the ground voltage (0V), and the word line WL receives the on voltage $V_{ON}$. For example, the read voltage VREAD is in the range between 0.4V and 1.6V. When the read action is performed, the select transistor $M_{GAA\_sel}$ of the memory cell is turned on. Since the gate dielectric layer 462 of the antifuse transistor $M_{GAA\_AF}$ is ruptured, the region between the gate layer 464 and the drain/source structure 492 of the antifuse transistor $M_{GAA\_AF}$ has a low resistance value. Under this circumstance, a higher read current IR is generated between the antifuse control line AF and the bit line BL.

Whereas, if the gate dielectric layer 462 of the antifuse transistor $M_{GAA\_AF}$ in the memory cell is not ruptured, the magnitude of the current IR generated between the antifuse control line AF and the bit line BL is very low (e.g., nearly zero).

In other words, the storage state of the memory cell can be determined as the high-resistance storage state or the low-resistance storage state according to the magnitude of the read current IR during the read action. In an embodiment, a reference current is provided. If the read current IR is higher than the reference current, it is determined that the memory cell is in the low-resistance storage state. Whereas, if the read current IR is lower than the reference current, it is determined that the memory cell is in the high-resistance storage state.

It is noted that the structure of the antifuse-type one time programming memory cell of the first embodiment may be properly modified. In a variant example, the thickness of the gate dielectric layer 422 of the gate structure 420 in the select transistor $M_{GAA\_sel}$ is larger than the thickness of the gate dielectric layer 462 of the gate structure 460 in the antifuse transistor $M_{GAA\_AF}$. Consequently, the leakage current generated by the memory cell is reduced, and the reliability of the memory cell is enhanced.

In another variant example, the cross section areas of the nanowires in the select transistor $M_{GAA\_sel}$ and the antifuse transistor $M_{GAA\_AF}$ are modified. For example, the cross section area of the nanowire in the select transistor $M_{GAA\_sel}$ is larger than the cross section area of the nanowire in the antifuse transistor $M_{GAA\_AF}$. In this way, a lower program voltage $V_{PP}$ is sufficient to complete the program action.

In the memory cell of the first embodiment, each of the select transistor $M_{GAA\_sel}$ and the antifuse transistor $M_{GAA\_AF}$ has a single nanowire. It is noted that numerous modifications and alterations may be made while retaining the teachings of the invention. For example, in some other embodiments, each of the select transistor $M_{GAA\_sel}$ and the antifuse transistor $M_{GAA\_AF}$ has two or more than two nanowires. In the following two embodiments (i.e., the second and third embodiments), the GAA transistor of the memory cell has three nanowires.

FIG. 6A is a schematic cross-sectional view illustrating the structure of an antifuse-type one time programming memory cell according to a second embodiment of the present invention. The memory cell of the second embodiment comprises two GAA transistors. The two GAA transistors include a select transistor $M_{GAA\_sel}$ and an antifuse transistor $M_{GAA\_AF}$. The select transistor $M_{GAA\_sel}$ and the antifuse transistor $M_{GAA\_AF}$ are formed over a semiconductor substrate sub. The three-dimensional structure of each of the select transistor $M_{GAA\_sel}$ and the antifuse transistor $M_{GAA\_AF}$ is similar to that of FIG. 2A, and not redundantly described herein.

The select transistor $M_{GAA\_sel}$ comprises a drain/source structure 696, a drain/source structure 698, a gate structure and three nanowires 612, 620 and 630. The gate structure is formed above the semiconductor sub. The gate structure comprises two spacers 691 and 692, three dielectric gate layers 672, 674 and 676, and a gate layer 678. The dielectric gate layer 672 surrounds the central region of the first nanowire 612. The dielectric gate layer 674 surrounds the central region of the second nanowire 620. The dielectric gate layer 676 surrounds the central region of the third nanowire 630. The gate layer 678 surrounds the dielectric gate layers 672, 674 and 676. The gate layer 678 is formed on the isolation layer 610. The first side regions of the nanowires 612, 620 and 630 are surrounded by the spacer 691, the second side regions of the nanowires 612, 620 and 630 are surrounded by the spacer 692, and the spacers 691 and 692 are formed on the semiconductor substrate sub. The nanowires 612, 620 and 630 that are surrounded by the gate structure are nanowire channel regions of the select transistor $M_{GAA\_sel}$. Furthermore, two drain/source structures 696 and 698 are formed above the isolation layer 610, and located on both sides of the gate structure. The drain/source structure 696 is electrically contacted with the first terminals of the nanowires 612, 620 and 630, and the drain/source structure 698 is electrically contacted with the second terminals of the nanowires 612, 620 and 630.

The antifuse transistor $M_{GAA\_AF}$ comprises the drain/source structure 698, a drain/source structure 699, a gate structure and three nanowires 640, 650 and 660. The gate structure is formed above the semiconductor sub. The gate structure comprises two spacers 693 and 694, three dielectric gate layers 682, 684 and 686, and a gate layer 688. The dielectric gate layer 682 surrounds the central region of the first nanowire 640. The dielectric gate layer 684 surrounds the central region of the second nanowire 650. The dielectric gate layer 686 surrounds the central region of the third nanowire 660. The gate layer 688 surrounds the dielectric gate layers 682, 684 and 686. The gate layer 688 is formed on the isolation layer 610. The first side regions of the nanowires 640, 650 and 660 are surrounded by the spacer 693, the second side regions of the nanowires 640, 650 and 660 are surrounded by the spacer 694, and the spacers 693 and 694 are formed on the semiconductor substrate sub. The nanowires 640, 650 and 660 that are surrounded by the gate structure are nanowire channel regions of the antifuse transistor $M_{GAA\_AF}$. Furthermore, two drain/source structures 698 and 699 are formed above the isolation layer 610, and located on both sides of the gate structure. The drain/source structure 698 is electrically contacted with the first terminals of the nanowires 640, 650 and 660, and the drain/source structure 699 is electrically contacted with the second terminals of the nanowires 640, 650 and 660.

According to a second embodiment of the present invention, the drain/source structure 698 is shared by the select transistor $M_{GAA\_sel}$ and the antifuse transistor $M_{GAA\_AF}$. Furthermore, the drain/source structures 696, 698 and 699, and the nanowires 612, 620, 630, 640, 650 and 660 in the antifuse-type one time programming memory cell may have the same dopant type. For example, the drain/source structures 696, 698 and 699, and the nanowires 612, 620, 630, 640, 650 and 660 are n-type doped regions or p-type doped regions.

In the memory cell of the second embodiment, the drain/source structure 696 is connected with a bit line BL, the gate layer 678 of the select transistor $M_{GAA\_sel}$ is connected with a word line WL, and the gate layer 688 of the antifuse transistor $M_{GAA\_AF}$ is connected with an antifuse control line AF. For example, the nanowires 612, 620, 630, 640, 650, 660 in the memory cell are rectangular nanowires or cylindrical nanowires.

The methods of performing the program action, the program inhibition action and the read action on the memory cell of the second embodiment are similar to those of the first embodiment. For succinctness, only the program action performed on the memory cell of the second embodiment will be described as follows.

Figure 6B:
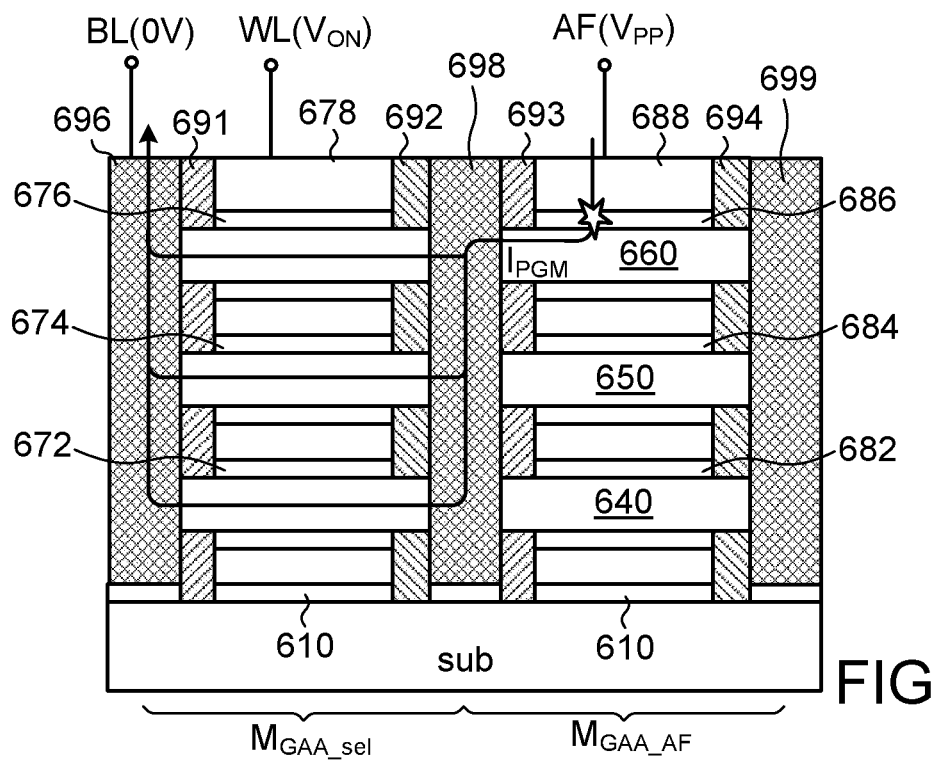
FIG. 6B schematically illustrates associated bias voltages for performing a program action on the memory cell according to the second embodiment of the present invention.

FIG. 6B schematically illustrates associated bias voltages for performing a program action on the memory cell according to the second embodiment of the present invention. Please refer to FIG. 6B. When the program action is performed, the antifuse control line AF receives a program voltage $V_{PP}$, the bit line BL receives a ground voltage (0V), and the word line WL receives an on voltage $V_{ON}$. For example, the program voltage $V_{PP}$ is in the range between 3V and 6V, and the on voltage $V_{ON}$ is in the range between 0.4V and 3V.

When the program action is performed, the select transistor $M_{GAA\_sel}$ of the memory cell is turned on. Consequently, the ground voltage (0V) of the bit line BL is transmitted to the drain/source structure 698 of the antifuse transistor $M_{GAA\_AF}$ through the three nanowires 612, 620 and 630 of the select transistor $M_{GAA\_sel}$. When the antifuse control line AF receives the program voltage $V_{PP}$, the voltage stress between the nanowires 640, 650 and 660, and the gate layer 668 of the antifuse transistor $M_{GAA\_AF}$ is equal to the program voltage $V_{PP}$. Under this circumstance, one of the gate dielectric layers 682, 684 and 686 of the antifuse transistor $M_{GAA\_AF}$ is ruptured. For example, if the gate dielectric layer 686 is ruptured, the memory cell generates a program current $I_{PGM}$. The program current $I_{PGM}$ flows from the antifuse control line AF to the bit line BL. Consequently, the region between the gate layer 688 and the drain/source structure 698 of the antifuse transistor $M_{GAA\_AF}$ has a low resistance value. That is, the memory cell is programmed to a low-resistance storage state.

It is noted that the structure of the antifuse-type one time programming memory cell of the second embodiment may be properly modified. In a variant example, the thickness of each of the gate dielectric layers 672, 674 and 676 of the gate structure in the select transistor $M_{GAA\_sel}$ is larger than the thickness of each of the gate dielectric layers 682, 684 and 686 of the gate structure in the antifuse transistor $M_{GAA\_AF}$. Consequently, the leakage current generated by the memory cell is reduced, and the reliability of the memory cell is enhanced.

In another variant example, the cross section areas of the nanowires in the select transistor $M_{GAA\_sel}$ and the antifuse transistor $M_{GAA\_AF}$ are modified. For example, the cross section area of the nanowire in the select transistor $M_{GAA\_sel}$ is larger than the cross section area of the nanowire in the antifuse transistor $M_{GAA\_AF}$. In this way, a lower program voltage $V_{PP}$ is sufficient to complete the program action.

In the memory cell of the second embodiment, each of the select transistor $M_{GAA\_sel}$ and the antifuse transistor $M_{GAA\_AF}$ has three nanowires. It is noted that numerous modifications and alterations may be made while retaining the teachings of the invention. For example, in some other embodiments, the select transistor $M_{GAA\_sel}$ has X nanowires, and the antifuse transistor $M_{GAA\_AF}$ has Y nanowires, wherein X and Y are positive integers. It is noted that X and Y may be identical or different. The select transistor $M_{GAA\_sel}$ and the antifuse transistor $M_{GAA\_AF}$ are integrated as an antifuse-type one time programming memory cell.

Figure 7:
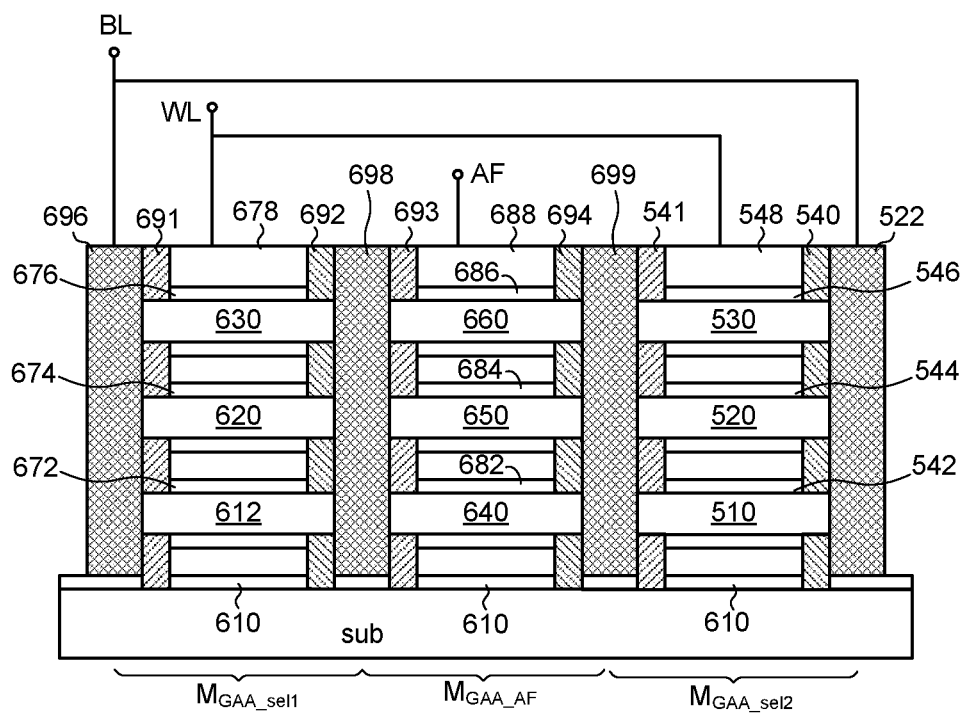
FIG. 7 is a schematic cross-sectional view illustrating the structure of an antifuse-type one time programming memory cell according to a third embodiment of the present invention.

FIG. 7 is a schematic cross-sectional view illustrating the structure of an antifuse-type one time programming memory cell according to a third embodiment of the present invention. In comparison with the second embodiment, the memory cell of the third embodiment further comprises an additional GAA transistor. For succinctness, the additional GAA transistor will be described as follows. The other components of the memory cell of the third embodiment are similar to those of the second embodiment, and not redundantly described herein.

As shown in FIG. 7, the memory cell of the third embodiment further comprises a first select transistor $M_{GAA\_sel1}$, an antifuse transistor $M_{GAA\_AF}$ and a second select transistor $M_{GAA\_sel2}$. These transistors are formed over a semiconductor substrate sub. In comparison with the second embodiment, the memory cell of this embodiment further comprises the second select transistor $M_{GAA\_sel2}$.

The second select transistor $M_{GAA\_sel2}$ comprises the drain/source structure 699, a drain/source structure 522, a gate structure and three nanowires 510, 520 and 530. The gate structure is formed above the semiconductor sub. The gate structure comprises two spacers 541 and 540, three dielectric gate layers 542, 544 and 546 and a gate layer 548. The dielectric gate layer 542 surrounds the central region of the first nanowire 510. The dielectric gate layer 544 surrounds the central region of the second nanowire 520. The dielectric gate layer 546 surrounds the central region of the third nanowire 530. The gate layer 548 surrounds the dielectric gate layers 542, 544 and 546. The gate layer 548 is formed on the isolation layer 610. The first side regions of the nanowires 510, 520, and 530 are surrounded by the spacer 541, the second side regions of the nanowires 510, 520, and 530 are surrounded by the spacer 540, and the spacers 541 and 540 are formed on the semiconductor substrate sub. The nanowires 510, 520 and 530 that are surrounded by the gate structure are nanowire channel regions of the second select transistor $M_{GAA\_sel2}$. Furthermore, two drain/source structures 699 and 522 are formed above the isolation layer 610, and located on both sides of the gate structure. The drain/source structure 699 is electrically contacted with the first terminals of the nanowires 510, 520 and 530, and the drain/source structure 522 is electrically contacted with the second terminals of the nanowires 510, 520 and 530.

According to a third embodiment of the present invention, the drain/source structure 699 is shared by the second select transistor $M_{GAA\_sel2}$ and the antifuse transistor $M_{GAA\_AF}$. Furthermore, the drain/source structures 696, 698, 699 and 522, and the nanowires 612, 620, 630, 640, 650, 660, 510, 520, 530 and 540 in the antifuse-type one time programming memory cell may have the same dopant type.

In the memory cell of the third embodiment, the gate layer 548 of the second select transistor $M_{GAA\_sel2}$ and the gate layer 678 of the first select transistor $M_{GAA\_sel1}$ are connected with the word line WL, and the drain/source structure 522, 696 are connected with the bit line BL. The methods of performing the program action, the program inhibition action and the read action on the memory cell of the third embodiment are similar to those of the second embodiment, and not redundantly described herein.

In the memory cell of the third embodiment, each of the first select transistor $M_{GAA\_sel1}$, the antifuse transistor $M_{GAA\_AF}$ and the second select transistor $M_{GAA\_sel2}$ has three nanowires. It is noted that numerous modifications and alterations may be made while retaining the teachings of the invention. For example, in some other embodiments, the first select transistor $M_{GAA\_sel1}$ has X nanowires, the antifuse transistor $M_{GAA\_AF}$ has Y nanowires, and the second select transistor $M_{GAA\_sel2}$ has Z nanowires, wherein X, Y and Z are positive integers. It is noted that X, Y and Z may be identical or different. The first select transistor $M_{GAA\_sel1}$, the antifuse transistor $M_{GAA\_AF}$ and the second select transistor $M_{GAA\_sel2}$ are integrated as an antifuse-type one time programming memory cell.

Figure 8:
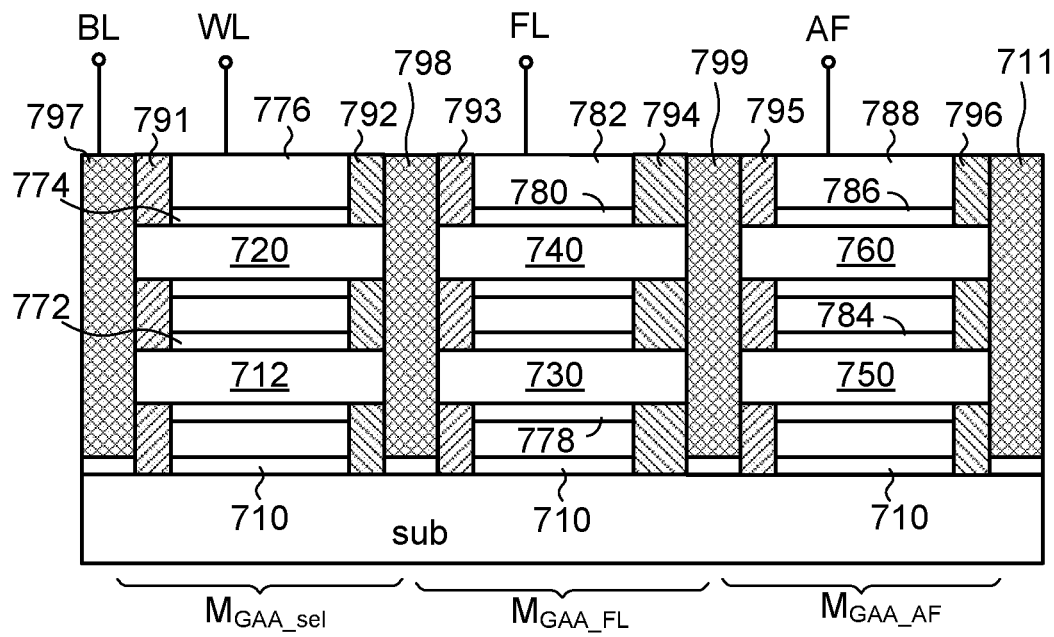
FIG. 8 is a schematic cross-sectional view illustrating the structure of an antifuse-type one time programming memory cell according to a fourth embodiment of the present invention.

FIG. 8 is a schematic cross-sectional view illustrating the structure of an antifuse-type one time programming memory cell according to a fourth embodiment of the present invention. In this embodiment, the memory cell comprises three GAA transistors. The three GAA transistors include a select transistor $M_{GAA\_sel}$, a following transistor $M_{GAA\_FL}$ and an antifuse transistor $M_{GAA\_AF}$. The select transistor $M_{GAA\_sel}$, the following transistor $M_{GAA\_FL}$ and the antifuse transistor $M_{GAA\_AF}$ are formed over the semiconductor substrate sub. In the following four embodiments (i.e., the fourth embodiment to the seventh embodiments), each of the select transistor $M_{GAA\_sel}$, the following transistor $M_{GAA\_FL}$ and the antifuse transistor $M_{GAA\_AF}$ has two nanowires.

The select transistor $M_{GAA\_sel}$ comprises a drain/source structure 797, a drain/source structure 798, a gate structure and two nanowires 712 and 720. The gate structure is formed above the semiconductor sub. The gate structure comprises two spacers 791 and 792, two dielectric gate layers 772 and 774 and a gate layer 776. The dielectric gate layer 772 surrounds the central region of the first nanowire 712. The dielectric gate layer 774 surrounds the central region of the second nanowire 720. The gate layer 776 surrounds the dielectric gate layers 772 and 774. The gate layer 776 is formed on the isolation layer 710. The first side regions of the nanowires 712 and 720 are surrounded by the spacer 791, the second side regions of the nanowires 712 and 720 are surrounded by the spacer 792, and the spacers 791 and 792 are formed on the semiconductor substrate sub. The nanowires 712 and 720 that are surrounded by the gate structure are nanowire channel regions of the select transistor $M_{GAA\_sel}$. Furthermore, two drain/source structures 797 and 798 are formed above the isolation layer 710, and located on both sides of the gate structure. The drain/source structure 797 is electrically contacted with the first terminals of the nanowires 712 and 720, and the drain/source structure 798 is electrically contacted with the second terminals of the nanowires 712 and 720.

The following transistor $M_{GAA\_FL}$ comprises the drain/source structure 798, a drain/source structure 799, a gate structure and two nanowires 730 and 740. The gate structure is formed above the semiconductor sub. The gate structure comprises two spacers 793 and 794, two dielectric gate layers 778 and 780, and a gate layer 782. The dielectric gate layer 778 surrounds the central region of the first nanowire 730. The dielectric gate layer 780 surrounds the central region of the second nanowire 740. The gate layer 782 surrounds the dielectric gate layers 778 and 780. The gate layer 782 is formed on the isolation layer 710. The first side regions of the nanowires 730 and 740 are surrounded by the spacer 793, the second side regions of the nanowires 730 and 740 are surrounded by the spacer 794, and the spacers 793 and 794 are formed on the semiconductor substrate sub. The nanowires 730 and 740 that are surrounded by the gate structure are nanowire channel regions of the following transistor $M_{GAA\_FL}$. Furthermore, two drain/source structures 798 and 799 are formed above the isolation layer 710, and located on both sides of the gate structure. The drain/source structure 798 is electrically contacted with the first terminals of the nanowires 730 and 740, and the drain/source structure 799 is electrically contacted with the second terminals of the nanowires 730 and 740.

The antifuse transistor $M_{GAA\_AF}$ comprises the drain/source structure 799, a drain/source structure 711, a gate structure and two nanowires 750 and 760. The gate structure is formed above the semiconductor sub. The gate structure comprises two spacers 795 and 796, two dielectric gate layers 784 and 786, and a gate layer 788. The dielectric gate layer 784 surrounds the central region of the first nanowire 750. The dielectric gate layer 786 surrounds the central region of the second nanowire 760. The gate layer 788 surrounds the dielectric gate layers 784 and 786. The gate layer 788 is formed on the isolation layer 710. The first side regions of the nanowires 750 and 760 are surrounded by the spacer 795, the second side regions of the nanowires 750 and 760 are surrounded by the spacer 796, and the spacers 795 and 796 are formed on the semiconductor substrate sub. The nanowires 750 and 760 that are surrounded by the gate structure are nanowire channel regions of the antifuse transistor $M_{GAA\_AF}$. Furthermore, two drain/source structures 799 and 711 are formed above the isolation layer 710, and located on both sides of the gate structure. The drain/source structure 799 is electrically contacted with the first terminals of the nanowires 750 and 760, and the drain/source structure 711 is electrically contacted with the second terminals of the nanowires 750 and 760.

According to a fourth embodiment of the present invention, the drain/source structure 798 is shared by the select transistor $M_{GAA\_sel}$ and the following transistor $M_{GAA\_FL}$, and the drain/source structure 799 is shared by the following transistor $M_{GAA\_FL}$ and the antifuse transistor $M_{GAA\_AF}$. Furthermore, the drain/source structures 797, 798, 799 and 711, and the nanowires 712, 720, 730, 740, 750 and 760 in the antifuse-type one time programming memory cell may have the same dopant type.

In the memory cell of the fourth embodiment, the drain/source structure 797 is connected with a bit line BL, the gate layer 776 of the select transistor $M_{GAA\_sel}$ is connected with a word line WL, the gate layer 782 of the following transistor $M_{GAA\_FL}$ is connected with a following line FL, and the gate layer 788 of the antifuse transistor $M_{GAA\_AF}$ is connected with an antifuse control line AF. For example, the nanowires of the memory cell are rectangular nanowires or cylindrical nanowires.

Similarly, the structure of the antifuse-type one time programming memory cell of the fourth embodiment may be properly modified. In a variant example, the thickness of each of the gate dielectric layers 772 and 774 in the select transistor $M_{GAA\_sel}$ is larger than the thickness of each of the gate dielectric layers 784 and 786 in the antifuse transistor $M_{GAA\_AF}$. In another variant example, the cross section areas of the nanowires in the antifuse transistor $M_{GAA\_AF}$ and the select transistor $M_{GAA\_sel}$ are modified. For example, the cross section area of the nanowire in the antifuse transistor $M_{GAA\_AF}$ is smaller than the cross section area of the nanowire in the select transistor $M_{GAA\_sel}$.

Figure 9A:
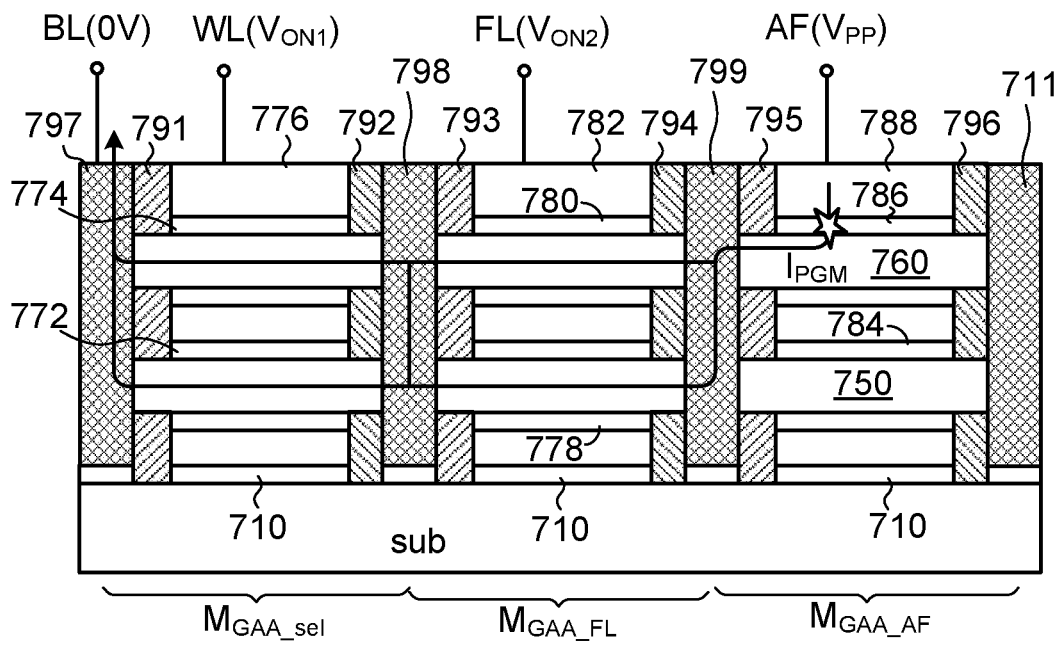
FIG. 9A schematically illustrates associated bias voltages for performing a program action on the memory cell according to the fourth embodiment of the present invention.
Figure 9B:
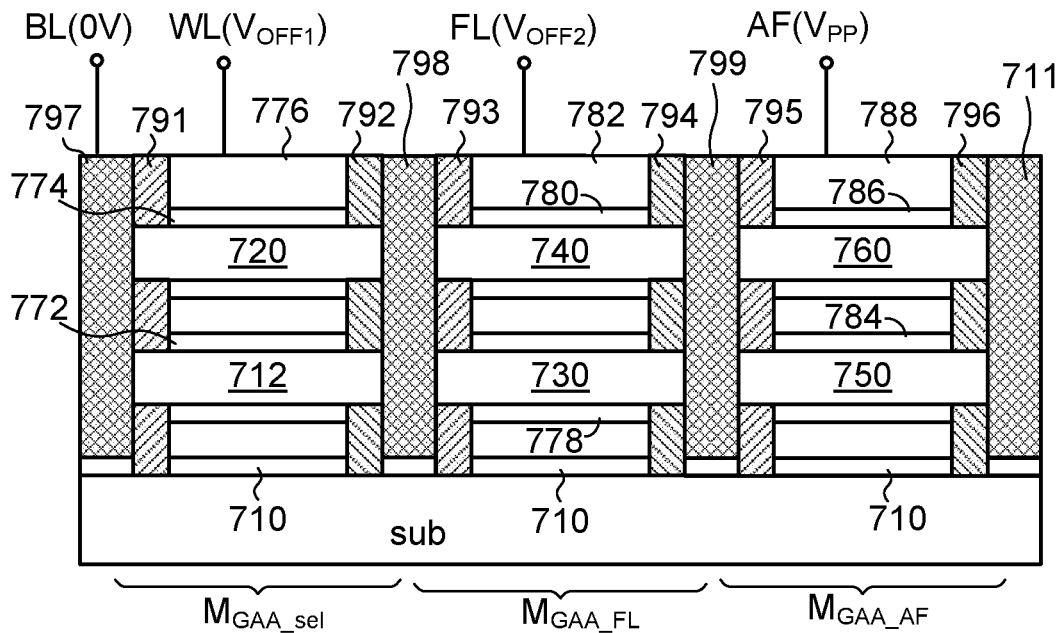
FIG. 9B schematically illustrates associated bias voltages for performing a program inhibition action on the memory cell according to the fourth embodiment of the present invention.
Figure 9C:
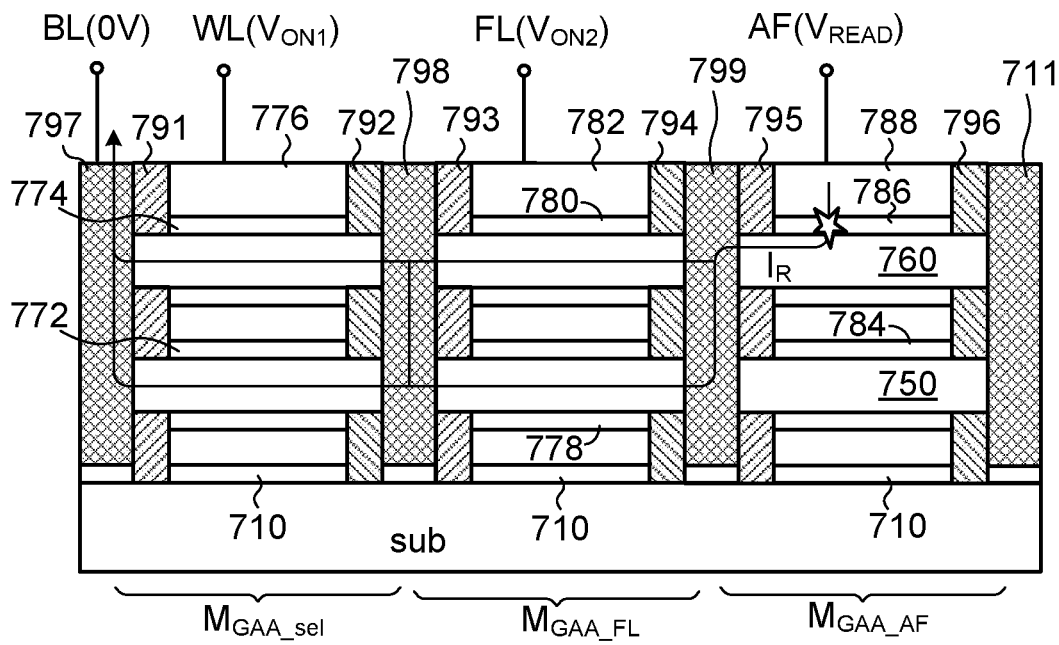
FIG. 9C schematically illustrates associated bias voltages for performing a read action on the memory cell according to the fourth embodiment of the present invention.

FIG. 9A schematically illustrates associated bias voltages for performing a program action on the memory cell according to the fourth embodiment of the present invention. FIG. 9B schematically illustrates associated bias voltages for performing a program inhibition action on the memory cell according to the fourth embodiment of the present invention. FIG. 9C schematically illustrates associated bias voltages for performing a read action on the memory cell according to the fourth embodiment of the present invention.

Please refer to FIG. 9A. When the program action is performed, the antifuse control line AF receives a program voltage $V_{PP}$, the bit line BL receives a ground voltage (0V), the word line WL receives a first on voltage $V_{ON1}$, and the following line FL receives a second on voltage $V_{ON2}$. For example, the program voltage $V_{PP}$ is in the range between 3V and 6V, the first on voltage $V_{ON1}$ is in the range between 0.4V and 3V, and the second on voltage $V_{ON2}$ is in the range between 0.4V and 3V. Moreover, the magnitude of the second on voltage $V_{ON2}$ is equal to or higher than the magnitude of the first on voltage $V_{ON1}$.

When the program action is performed, the select transistor $M_{GAA\_sel}$ and the following transistor $M_{GAA\_FL}$ are turned on. Consequently, the ground voltage (0V) of the bit line BL is transmitted to the drain/source structure 799 of the antifuse transistor $M_{GAA\_AF}$ through the nanowires of the select transistor $M_{GAA\_sel}$ and the following transistor $M_{GAA\_FL}$. When the antifuse control line AF receives the program voltage $V_{PP}$, the voltage stress between the nanowires 750 and 760 and the gate layer 788 of the antifuse transistor $M_{GAA\_AF}$ is equal to the program voltage $V_{PP}$. Under this circumstance, one of the gate dielectric layers 784 and 786 is ruptured. For example, if the gate dielectric layer 786 is ruptured, the memory cell generates a program current $I_{PGM}$. The program current $I_{PGM}$ flows from the antifuse control line AF to the bit line BL. Consequently, the region between the gate layer 788 and the drain/source structure 799 of the antifuse transistor $M_{GAA\_AF}$ has a low resistance value. That is, the memory cell is programmed to a low-resistance storage state.

Please refer to FIG. 9B. When the program inhibition action is performed, the antifuse control line AF receives the program voltage $V_{PP}$, the bit line BL receives the ground voltage (0V), the word line WL receives a first off voltage $V_{OFF1}$, and the following line FL receives the second off voltage $V_{OFF2}$. When the program inhibition action is performed, the select transistor $M_{GAA\_sel}$ and the following transistor $M_{GAA\_FL}$ of the memory cell are turned off. Consequently, the ground voltage (0V) of the bit line BL cannot be transmitted to the drain/source structure 799 of the antifuse transistor $M_{GAA\_AF}$. When the antifuse control line AF receives the program voltage $V_{PP}$, the voltage stress between the gate layer 788 and the nanowires 750 and 760 of the antifuse transistor $M_{GAA\_AF}$ is very low. Under this circumstance, the program current $I_{PGM}$ is not generated, and the gate dielectric layers 784 and 786 of the antifuse transistor $M_{GAA\_AF}$ are not ruptured. Consequently, the region between the gate layer 788 and the drain/source structure 799 of the antifuse transistor $M_{GAA\_AF}$ is maintained in a high resistance value. That is, the memory cell is maintained in a high-resistance storage state.

In another embodiment, when the program inhibition action is performed, the antifuse control line AF is in a floating state. Consequently, regardless of whether the select transistor $M_{GAA\_sel}$ and the following transistor $M_{GAA\_FL}$ are turned on or turned off, the gate dielectric layers 784 and 786 of the antifuse transistor $M_{GAA\_AF}$ are not ruptured. That is, the memory cell is maintained in the high-resistance storage state. Or, when the program inhibition action is performed, the bit line BL receives a voltage equals to the first on voltage $V_{ON1}$. Consequently, the memory cell is maintained in the high-resistance storage state.

Please refer to FIG. 9C. When the read action is performed, the antifuse control line AF receives a read voltage VREAD, the bit line BL receives the ground voltage (0V), the word line WL receives the first on voltage $V_{ON1}$, and the following line FL receives the second on voltage $V_{ON2}$. For example, the read voltage VREAD is in the range between 0.4V and 1.6V. When the read action is performed, the select transistor $M_{GAA\_sel}$ and the following transistor $M_{GAA\_FL}$ of the memory cell are turned on. Since the gate dielectric layer 786 of the antifuse transistor $M_{GAA\_AF}$ is ruptured, the region between the gate layer 788 and the drain/source structure 799 has a low resistance value. Under this circumstance, a higher read current IR is generated between the antifuse control line AF and the bit line BL.

Whereas, if the gate dielectric layers 784 and 786 of the antifuse transistor $M_{GAA\_AF}$ in the memory cell are not ruptured, the magnitude of the current IR generated between the antifuse control line AF and the bit line BL is very low (nearly zero). In other words, when the read action is performed, the storage state of the memory cell can be determined as the high-resistance storage state or the low-resistance storage state according to the magnitude of the read current IR during the read action.

Figure 10:
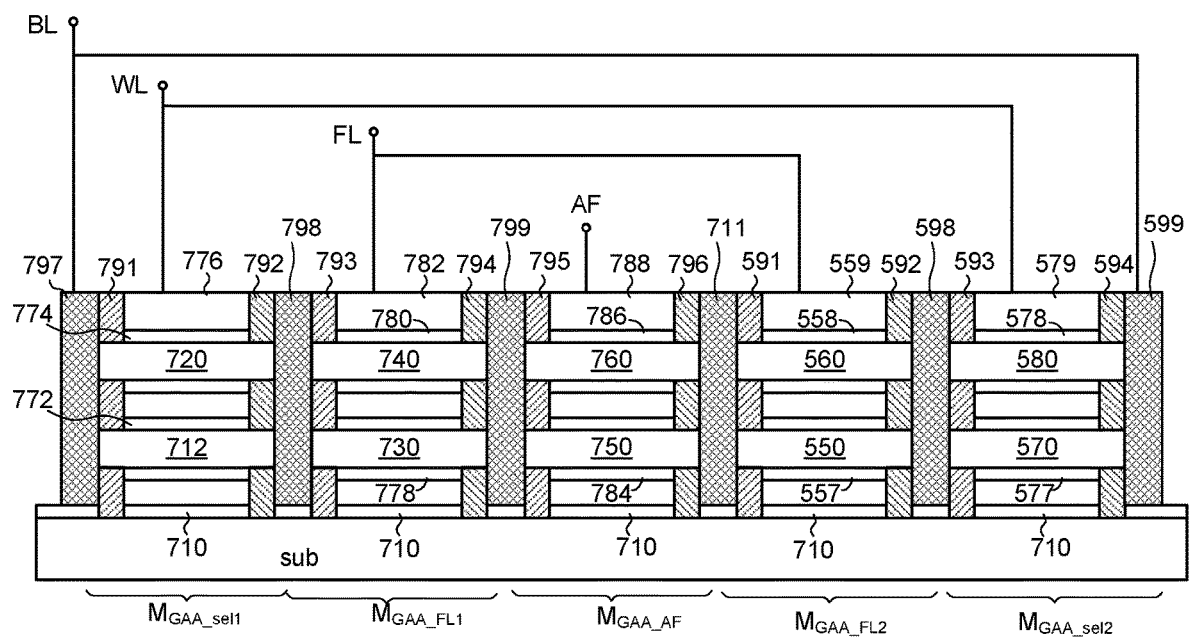
FIG. 10 is a schematic cross-sectional view illustrating the structure of an antifuse-type one time programming memory cell according to a fifth embodiment of the present invention.

FIG. 10 is a schematic cross-sectional view illustrating the structure of an antifuse-type one time programming memory cell according to a fifth embodiment of the present invention. In comparison with the fourth embodiment, the memory cell of the fifth embodiment further comprises two additional GAA transistors. For succinctness, the two additional GAA transistors will be described as follows. The other components of the memory cell of the fifth embodiment are similar to those of the fourth embodiment, and not redundantly described herein.

As shown in FIG. 10, the memory cell of the fifth embodiment comprises a first select transistor $M_{GAA\_sel1}$, a first a following transistor $M_{GAA\_FL1}$, an antifuse transistor $M_{GAA\_AF}$, a second select transistor $M_{GAA\_sel2}$ and a second following transistor $M_{GAA\_FL2}$. These transistors are formed over the semiconductor substrate sub. In comparison with the fourth embodiment, the memory cell of this embodiment further comprises the second following transistor $M_{GAA\_FL2}$ and the second select transistor $M_{GAA\_sel2}$.

The second following transistor $M_{GAA\_FL2}$ comprises the drain/source structure 711, a drain/source structure 598, a gate structure and two nanowires 550 and 560. The gate structure is formed above the semiconductor sub. The gate structure comprises two spacers 591 and 592, two dielectric gate layers 557 and 558, and a gate layer 559. The dielectric gate layer 557 surrounds the central region of the first nanowire 550. The dielectric gate layer 558 surrounds the central region of the second nanowire 560. The gate layer 559 surrounds the dielectric gate layers 557 and 558. The gate layer 559 is formed on the isolation layer 710. The first side regions of the nanowires 550 and 560 are surrounded by the spacer 591, the second side regions of the nanowires 550 and 560 are surrounded by the spacer 592, and the spacers 591 and 592 are formed on the semiconductor substrate sub. The nanowires 550 and 560 that are surrounded by the gate structure are nanowire channel regions of the second following transistor $M_{GAA\_FL2}$. Furthermore, two drain/source structures 711 and 598 are formed above the isolation layer 710, and located on both sides of the gate structure. The drain/source structure 711 is electrically contacted with the first terminals of the nanowires 550 and 560, and the drain/source structure 598 is electrically contacted with the second terminals of the nanowires 550 and 560.

The second select transistor $M_{GAA\_sel2}$ comprises the drain/source structure 598, a drain/source structure 599, a gate structure and two nanowires 570 and 580. The gate structure is formed above the semiconductor sub. The gate structure comprises two spacers 593 and 594, two dielectric gate layers 577 and 578 and a gate layer 579. The dielectric gate layer 577 surrounds the central region of the first nanowire 570. The dielectric gate layer 578 surrounds the central region of the second nanowire 580. The gate layer 579 surrounds the dielectric gate layers 577 and 578. The gate layer 579 is formed on the isolation layer 710. The first side regions of the nanowires 570 and 580 are surrounded by the spacer 593, the second side regions of the nanowires 570 and 580 are surrounded by the spacer 594, and the spacers 593 and 594 are formed on the semiconductor substrate sub. The nanowires 570 and 580 that are surrounded by the gate structure are nanowire channel regions of the second select transistor $M_{GAA\_sel2}$. Furthermore, two drain/source structures 598 and 599 are formed above the isolation layer 710, and located on both sides of the gate structure. The drain/source structure 598 is electrically contacted with the first terminals of the nanowires 570 and 580, and the drain/source structure 599 is electrically contacted with the second terminals of the nanowires 570 and 580.

According to a fifth embodiment of the present invention, the drain/source structure 711 is shared by the antifuse transistor $M_{GAA\_AF}$ and the second following transistor $M_{GAA\_FL2}$, and the drain/source structure 598 is shared by the second following transistor $M_{GAA\_FL}$ and the second following transistor $M_{GAA\_FL2}$. Furthermore, the drain/source structures 797, 798, 799, 711, 598 and 599, and the nanowires 712, 720, 730, 740, 750, 760, 550, 560, 570 and 580 in the antifuse-type one time programming memory cell may have the same dopant type.

In the memory cell of the fifth embodiment, the gate layer 559 of the second following transistor $M_{GAA\_FL2}$ and the gate layer 782 of the first following transistor $M_{GAA\_FL1}$ are connected with the following line FL, the gate layer 579 of the second select transistor $M_{GAA\_sel2}$ and the gate layer 776 of the first select transistor $M_{GAA\_sel1}$ are connected with the word line WL, and the drain/source structure 797, 599 are connected with the bit line BL. The methods of performing the program action, the program inhibition action and the read action on the memory cell of the fifth embodiment are similar to those of the fourth embodiment.

In the memory cell of the fifth embodiment, each of the first select transistor $M_{GAA\_sel1}$, the first a following transistor $M_{GAA\_FL1}$, the antifuse transistor $M_{GAA\_AF}$, the second select transistor $M_{GAA\_sel2}$ and the second following transistor $M_{GAA\_FL2}$ has two nanowires. It is noted that numerous modifications and alterations may be made while retaining the teachings of the invention. For example, in some other embodiments, the first select transistor $M_{GAA\_sel1}$ has V nanowires, the first a following transistor $M_{GAA\_FL1}$ has W nanowires, the antifuse transistor $M_{GAA\_AF}$ has X nanowires, the second select transistor $M_{GAA\_sel2}$ has Y nanowires, and the second following transistor $M_{GAA\_FL2}$ has Z nanowires, wherein V, W, X, Y and Z are positive integers. It is noted that V, W, X, Y and Z may be identical or different. The first select transistor $M_{GAA\_sel1}$, the first a following transistor $M_{GAA\_FL1}$, the antifuse transistor $M_{GAA\_AF}$, the second select transistor $M_{GAA\_sel2}$ and the second following transistor $M_{GAA\_FL2}$ are integrated as an antifuse-type one time programming memory cell.

Figure 11:
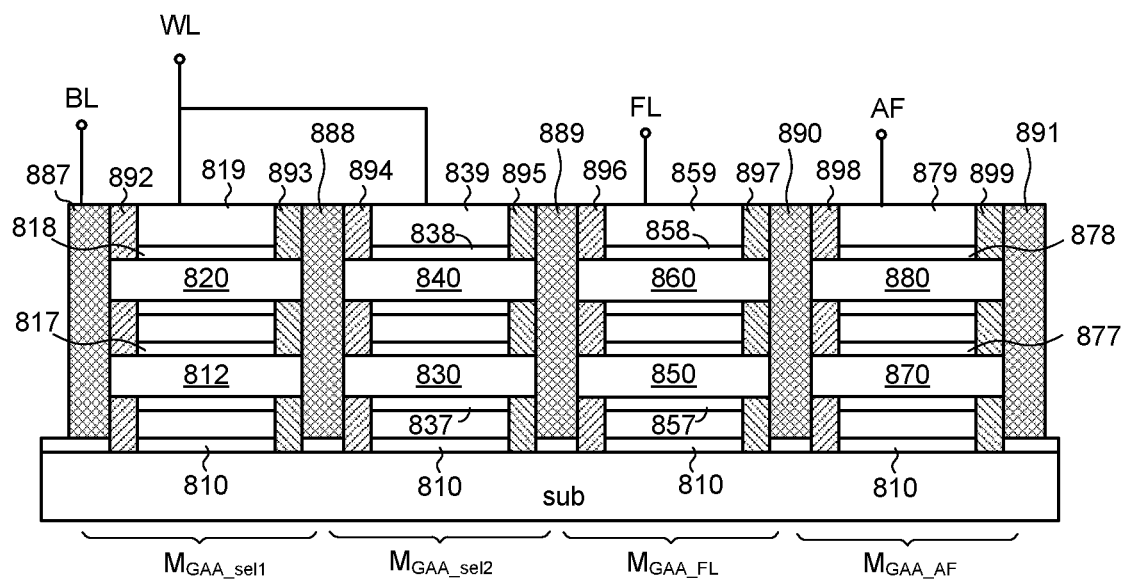
FIG. 11 is a schematic cross-sectional view illustrating the structure of an antifuse-type one time programming memory cell according to a sixth embodiment of the present invention.

FIG. 11 is a schematic cross-sectional view illustrating the structure of an antifuse-type one time programming memory cell according to a sixth embodiment of the present invention. In this embodiment, the memory cell comprises four GAA transistors. The four GAA transistors include a first select transistor $M_{GAA\_sel1}$, a second select transistor $M_{GAA\_sel2}$, a following transistor $M_{GAA\_FL}$ and an antifuse transistor $M_{GAA\_AF}$. The first select transistor $M_{GAA\_sel1}$, the second select transistor $M_{GAA\_sel2}$, the following transistor $M_{GAA\_FL}$ and the antifuse transistor $M_{GAA\_AF}$ are formed over the semiconductor substrate sub.

The first select transistor $M_{GAA\_sel1}$ comprises a drain/source structure 887, a drain/source structure 888, a gate structure and two nanowires 812 and 820. The gate structure is formed above the semiconductor sub. The gate structure comprises two spacers 892 and 893, two dielectric gate layers 817 and 818 and a gate layer 819. The dielectric gate layer 817 surrounds the central region of the first nanowire 812. The dielectric gate layer 818 surrounds the central region of the second nanowire 820. The gate layer 819 surrounds the dielectric gate layers 817 and 818. The gate layer 819 is formed on the isolation layer 810. The first side regions of the nanowires 812 and 820 are surrounded by the spacer 892, the second side regions of the nanowires 812 and 820 are surrounded by the spacer 893, and the spacers 892 and 893 are formed on the semiconductor substrate sub. The nanowires 812 and 820 that are surrounded by the gate structure are nanowire channel regions of the first select transistor $M_{GAA\_sel1}$. Furthermore, two drain/source structures 887 and 888 are formed above the isolation layer 810, and located on both sides of the gate structure. The drain/source structure 887 is electrically contacted with the first terminals of the nanowires 812 and 820, and the drain/source structure 888 is electrically contacted with the second terminals of the nanowires 812 and 820.

The second select transistor $M_{GAA\_sel2}$ comprises the drain/source structure 888, a drain/source structure 889, a gate structure and two nanowires 830 and 840. The gate structure is formed above the semiconductor sub. The gate structure comprises two spacers 894 and 895, two dielectric gate layers 837 and 838 and a gate layer 839. The dielectric gate layer 837 surrounds the central region of the first nanowire 830. The dielectric gate layer 838 surrounds the central region of the second nanowire 840. The gate layer 839 surrounds the dielectric gate layers 837 and 838. The gate layer 839 is formed on the isolation layer 810. The first side regions of the nanowires 830 and 840 are surrounded by the spacer 894, the second side regions of the nanowires 830 and 840 are surrounded by the spacer 895, and the spacers 894 and 895 are formed on the semiconductor substrate sub. The nanowires 830 and 840 that are surrounded by the gate structure are nanowire channel regions of the second select transistor $M_{GAA\_sel2}$. Furthermore, two drain/source structures 888 and 889 are formed above the isolation layer 810, and located on both sides of the gate structure. The drain/source structure 888 is electrically contacted with the first terminals of the nanowires 830 and 840, and the drain/source structure 889 is electrically contacted with the second terminals of the nanowires 830 and 840.

The following transistor $M_{GAA\_FL}$ comprises the drain/source structure 889, a drain/source structure 890, a gate structure and two nanowires 850 and 860. The gate structure is formed above the semiconductor sub. The gate structure comprises two spacer 896 and 897, two dielectric gate layers 857 and 858 and a gate layer 859. The dielectric gate layer 857 surrounds the central region of the first nanowire 850. The dielectric gate layer 858 surrounds the central region of the second nanowire 860. The gate layer 859 surrounds the dielectric gate layers 857 and 858. The gate layer 859 is formed on the isolation layer 810. The first side regions of the nanowires 850 and 860 are surrounded by the spacer 896, the second side regions of the nanowires 850 and 860 are surrounded by the spacer 897, and the spacers 896 and 897 are formed on the semiconductor substrate sub. The nanowires 850 and 860 that are surrounded by the gate structure are nanowire channel regions of the following transistor $M_{GAA\_FL}$. Furthermore, two drain/source structures 889 and 890 are formed above the isolation layer 810, and located on both sides of the gate structure. The drain/source structure 889 is electrically contacted with the first terminals of the nanowires 850 and 860, and the drain/source structure 890 is electrically contacted with the second terminals of the nanowires 850 and 860.

The antifuse transistor $M_{GAA\_AF}$ comprises the drain/source structure 890, a drain/source structure 891, a gate structure and two nanowires 870 and 880. The gate structure is formed above the semiconductor sub. The gate structure comprises two spacer 898 and 899, dielectric gate layers 877 and 878 and a gate layer 879. The dielectric gate layer 877 surrounds the central region of the first nanowire 870. The dielectric gate layer 878 surrounds the central region of the second nanowire 880. The gate layer 879 surrounds the dielectric gate layers 877 and 878. The gate layer 879 is formed on the isolation layer 810. The first side regions of the nanowires 870 and 880 are surrounded by the spacer 898, the second side regions of the nanowires 870 and 880 are surrounded by the spacer 899, and the spacers 898 and 899 are formed on the semiconductor substrate sub. The nanowires 870 and 880 that are surrounded by the gate structure are nanowire channel regions of the antifuse transistor $M_{GAA\_AF}$. Furthermore, two drain/source structures 890 and 891 are formed above the isolation layer 810, and located on both sides of the gate structure. The drain/source structure 890 is electrically contacted with the first terminals of the nanowires 870 and 880, and the drain/source structure 891 is electrically contacted with the second terminals of the nanowires 870 and 880.

According to a sixth embodiment of the present invention, the drain/source structure 888 is shared by the first select transistor $M_{GAA\_sel1}$ and the second select transistor $M_{GAA\_sel2}$, the drain/source structure 889 is shared by the second select transistor $M_{GAA\_sel2}$ and the following transistor $M_{GAA\_FL}$, and the drain/source structure 890 is shared by the following transistor $M_{GAA\_FL}$ and the antifuse transistor $M_{GAA\_AF}$. Furthermore, the drain/source structures 887, 888, 889, 890 and 891, and the nanowires 812, 820, 830, 840, 850, 860, 870 and 880 in the antifuse-type one time programming memory cell may have the same dopant type.

In the memory cell of the sixth embodiment, the drain/source structure 887 is connected with a bit line BL, the gate structure 819 of the first select transistor $M_{GAA\_sel1}$ and the gate layer 839 of the second select transistor $M_{GAA\_sel2}$ are connected with a word line WL, the gate layer 859 of the following transistor $M_{GAA\_FL}$ is connected with a following line FL, and the gate layer 879 of the antifuse transistor $M_{GAA\_AF}$ is connected with an antifuse line AF. For example, the nanowires of the memory cell are rectangular nanowires or cylindrical nanowires.

The methods of performing the program action, the program inhibition action and the read action on the memory cell of the sixth embodiment are similar to those of the fourth embodiment.

Figure 12:
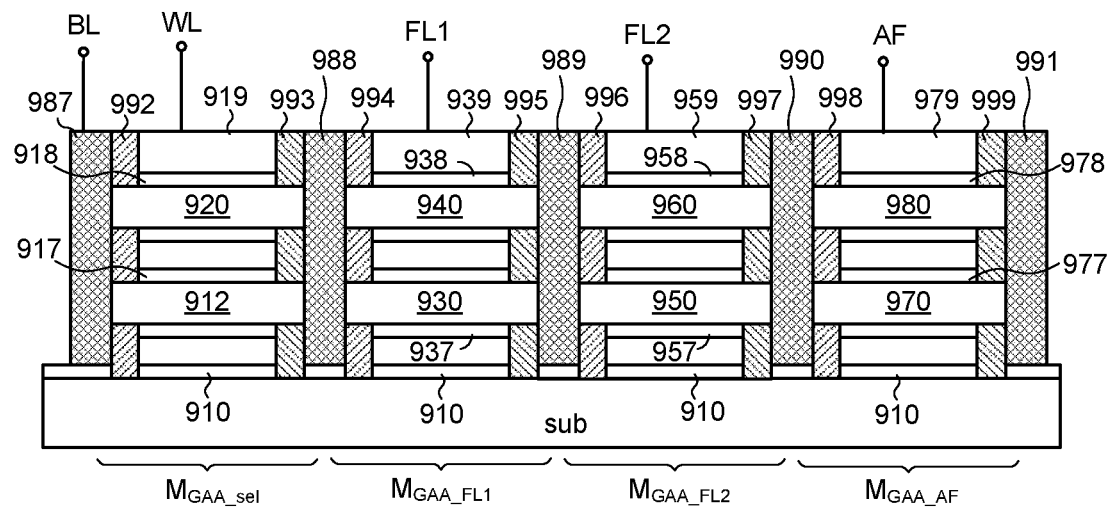
FIG. 12 is a schematic cross-sectional view illustrating the structure of an antifuse-type one time programming memory cell according to a seventh embodiment of the present invention.

FIG. 12 is a schematic cross-sectional view illustrating the structure of an antifuse-type one time programming memory cell according to a seventh embodiment of the present invention. In this embodiment, the memory cell comprises four GAA transistors. The four GAA transistors include a select transistor $M_{GAA\_sel}$, a first a following transistor $M_{GAA\_FL1}$, a second following transistor $M_{GAA\_FL2}$ and an antifuse transistor $M_{GAA\_AF}$. The select transistor $M_{GAA\_sel}$, the first a following transistor $M_{GAA\_FL1}$, the second following transistor $M_{GAA\_FL2}$ and the antifuse transistor $M_{GAA\_AF}$ are formed over the semiconductor substrate sub.

The select transistor $M_{GAA\_sel}$ comprises a drain/source structure 987, a drain/source structure 988, a gate structure and two nanowires 912 and 920. The gate structure is formed above the semiconductor sub. The gate structure comprises two spacer 992 and 993, dielectric gate layers 917 and 918 and a gate layer 919. The dielectric gate layer 917 surrounds the central region of the first nanowire 912. The dielectric gate layer 918 surrounds the central region of the second nanowire 920. The gate layer 919 surrounds the dielectric gate layers 917 and 918. The gate layer 919 is formed on the isolation layer 910. The first side regions of the nanowires 912 and 920 are surrounded by the spacer 992, the second side regions of the nanowires 912 and 920 are surrounded by the spacer 993, and the spacers 992 and 993 are formed on the semiconductor substrate sub. The nanowires 912 and 920 that are surrounded by the gate structure are nanowire channel regions of the select transistor $M_{GAA\_sel}$. Furthermore, two drain/source structures 987 and 988 are formed above the isolation layer 910, and located on both sides of the gate structure. The drain/source structure 987 is electrically contacted with the first terminals of the nanowires 912 and 920, and the drain/source structure 988 is electrically contacted with the second terminals of the nanowires 912 and 920.

The first following transistor $M_{GAA\_FL1}$ comprises the drain/source structure 988, a drain/source structure 989, a gate structure and two nanowires 930 and 940. The gate structure is formed above the semiconductor sub. The gate structure comprises two spacers 994 and 995, dielectric gate layers 937 and 938 and a gate layer 939. The dielectric gate layer 937 surrounds the central region of the first nanowire 930. The dielectric gate layer 938 surrounds the central region of the second nanowire 940. The gate layer 939 surrounds the dielectric gate layers 937 and 938. The gate layer 939 is formed on the isolation layer 910. The first side regions of the nanowires 930 and 940 are surrounded by the spacer 994, the second side regions of the nanowires 930 and 940 are surrounded by the spacer 995, and the spacers 994 and 995 are formed on the semiconductor substrate sub. The nanowires 930 and 940 that are surrounded by the gate structure are nanowire channel regions of the first following transistor $M_{GAA\_FL1}$. Furthermore, two drain/source structures 988 and 989 are formed above the isolation layer 910, and located on both sides of the gate structure. The drain/source structure 988 is electrically contacted with the first terminals of the nanowires 930 and 940, and the drain/source structure 989 is electrically contacted with the second terminals of the nanowires 930 and 940.

The second following transistor $M_{GAA\_FL2}$ comprises the drain/source structure 989, a drain/source structure 990, a gate structure and two nanowires. The gate structure is formed above the semiconductor sub. The gate structure comprises two spacers 996 and 997, dielectric gate layers 957 and 958 and a gate layer 959. The dielectric gate layer 957 surrounds the central region of the first nanowire 950. The dielectric gate layer 958 surrounds the central region of the second nanowire 960. The gate layer 959 surrounds the dielectric gate layers 957 and 958. The gate layer 959 is formed on the isolation layer 910. The first side regions of the nanowires 950 and 960 are surrounded by the spacer 996, the second side regions of the nanowires 950 and 960 are surrounded by the spacer 997, and the spacers 996 and 997 are formed on the semiconductor substrate sub. The nanowires 950 and 960 that are surrounded by the gate structure are nanowire channel regions of the second following transistor $M_{GAA\_FL2}$. Furthermore, two drain/source structures 989 and 990 are formed above the isolation layer 910, and located on both sides of the gate structure. The drain/source structure 989 is electrically contacted with the first terminals of the nanowires 950 and 960, and the drain/source structure 990 is electrically contacted with the second terminals of the nanowires 950 and 960.

The antifuse transistor $M_{GAA\_AF}$ comprises the drain/source structure 990, a drain/source structure 991, a gate structure and two nanowires 970 and 980. The gate structure is formed above the semiconductor sub. The gate structure comprises two spacers 998 and 999, dielectric gate layers 977 and 978 and a gate layer 979. The dielectric gate layer 977 surrounds the central region of the first nanowire 970. The dielectric gate layer 978 surrounds the central region of the second nanowire 980. The gate layer 979 surrounds the dielectric gate layers 977 and 978. The gate layer 979 is formed on the isolation layer 910. The first side regions of the nanowires 970 and 980 are surrounded by the spacer 998, the second side regions of the nanowires 970 and 980 are surrounded by the spacer 999, and the spacers 998 and 999 are formed on the semiconductor substrate sub. The nanowires 970 and 980 that are surrounded by the gate structure are nanowire channel regions of the antifuse transistor $M_{GAA\_AF}$. Furthermore, two drain/source structures 990 and 991 are formed above the isolation layer 910, and located on both sides of the gate structure. The drain/source structure 990 is electrically contacted with the first terminals of the nanowires 970 and 980, and the drain/source structure 991 is electrically contacted with the second terminals of the nanowires 970 and 980.

According to a seventh embodiment of the present invention, the drain/source structure 988 is shared by the select transistor $M_{GAA\_sel}$ and the first following transistor $M_{GAA\_FL1}$, the drain/source structure 989 is shared by the first following transistor $M_{GAA\_FL1}$ and the second following transistor $M_{GAA\_FL2}$, and the drain/source structure 990 is shared by the second following transistor $M_{GAA\_FL2}$ and the antifuse transistor $M_{GAA\_AF}$. Furthermore, the drain/source structures 987, 988, 989, 990 and 991, and the nanowires 912, 920, 930, 940, 950, 960, 970 and 980 in the antifuse-type one time programming memory cell may have the same dopant type.

In the memory cell of the seventh embodiment, the drain/source structure 987 is connected with a bit line BL, the gate layer 919 of the select transistor $M_{GAA\_sel}$ is connected with a word line WL, the gate layer 939 of the first following transistor $M_{GAA\_FL1}$ is connected with a first following line FL1, the gate layer 959 of the second following transistor $M_{GAA\_FL2}$ is connected with a second following line FL2, and the gate layer 979 of the antifuse transistor $M_{GAA\_AF}$ is connected with an antifuse line AF. For example, the nanowires of the memory cell are rectangular nanowires or cylindrical nanowires.

In the memory cells of the sixth embodiment and the seventh embodiment, each of the four GAA transistors comprises two nanowires. It is noted that the number of nanowires in each GAA transistor is not restricted. For example, in another embodiment, each GAA transistor comprises at least one nanowire. Moreover, the numbers of nanowires in different GAA transistors may be identical or different.

In some other embodiments, the GAA transistor as shown in FIG. 1B or 2B (i.e., the antifuse transistor) and any other appropriate type select transistor (e.g., a fin field-effect transistor) are combined as the antifuse-type one time programming memory cell of the present invention. For example, the GAA transistor as shown in FIG. 2B is used as an antifuse transistor, and the fin field-effect transistor is used as a select transistor. The antifuse transistor and the select transistor are collaboratively formed as the antifuse-type one time programming memory cell of the present invention. The first drain/source terminal of the select transistor is connected with a bit line BL. The gate terminal of the select transistor is connected with a word line WL. The second drain/source terminal of the select transistor is connected with the drain/source structure 232. Moreover, the gate layer 228 of the gate structure is connected with an antifuse control line AF.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type one time programming memory cell, comprising:
    a semiconductor substrate;
    an isolation layer formed on a surface of the semiconductor substrate;
    a first nanowire;
    a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate;
    a first drain/source structure formed over the isolation layer and electrically contacted with a first terminal of the first nanowire;
    a second drain/source structure formed over the isolation layer and electrically contacted with a second terminal of the first nanowire; wherein the first nanowire, the first gate structure, the first drain/source structure and the second drain/source structure are collaboratively formed as a first select transistor;
    a second nanowire, wherein a first terminal of the second nanowire is electrically contacted with the second drain/source structure;
    a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate; and
    a third drain/source structure formed over the isolation layer and electrically contacted with a second terminal of the second nanowire; wherein the second nanowire, the second gate structure, the second drain/source structure and the third drain/source structure are collaboratively formed as an antifuse transistor;
    wherein each of the first select transistor and the antifuse transistor is a gate-all-around transistor, the first drain/source structure is connected with a bit line, the first gate layer of the first gate structure is connected with a word line, and the second gate layer of the second gate structure is connected with an antifuse control line.

2. The antifuse-type one time programming memory cell as claimed in claim 1, wherein a thickness of the first gate dielectric layer is larger than a thickness of the second gate dielectric layer.

3. The antifuse-type one time programming memory cell as claimed in claim 1, wherein a cross section area of the second nanowire is smaller than a cross section area of the first nanowire.

4. The antifuse-type one time programming memory cell as claimed in claim 1, further comprising:
    a third nanowire, wherein a first terminal of the third nanowire is electrically contacted with the third drain/source structure;
    a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is located over the isolation layer, a first side region of the third nanowire is surrounded by the fifth spacer, a second side region of the third nanowire is surrounded by the sixth spacer, and the fifth spacer and the sixth spacer are located over the semiconductor substrate; and
    a fourth drain/source structure formed over the isolation layer and electrically contacted with a second terminal of the third nanowire;
    wherein the third nanowire, the third gate structure, the third drain/source structure and the fourth drain/source structure are collaboratively formed as a second select transistor;

wherein the second select transistor is the gate-all-around transistor, the fourth drain/source structure is connected with the bit line, and the third gate layer of the third gate structure is connected with the word line.

5. The antifuse-type one time programming memory cell as claimed in claim 1, further comprising:
a third nanowire, wherein a first terminal of the third nanowire is electrically contacted with the first drain/source structure, and a second terminal of the third nanowire is electrically contacted with the second drain/source structure;
wherein the first gate structure further comprises a third gate dielectric layer, a central region of the third nanowire is surrounded by the third gate dielectric layer, the third gate dielectric layer is surrounded by the first gate layer, a first side region of the third nanowire is surrounded by the first spacer, and a second side region of the third nanowire is surrounded by the second spacer.

6. The antifuse-type one time programming memory cell as claimed in claim 1, further comprising:
a third nanowire, wherein a first terminal of the third nanowire is electrically contacted with the second drain/source structure, and a second terminal of the third nanowire is electrically contacted with the third drain/source structure;
wherein the second gate structure further comprises a third gate dielectric layer, a central region of the third nanowire is surrounded by the third gate dielectric layer, the third gate dielectric layer is surrounded by the second gate layer, a first side region of the third nanowire is surrounded by the third spacer, and a second side region of the third nanowire is surrounded by the fourth spacer.

7. The antifuse-type one time programming memory cell as claimed in claim 1, further comprising:
a third nanowire, wherein a first terminal of the third nanowire is electrically contacted with the first drain/source structure, and a second terminal of the third nanowire is electrically contacted with the second drain/source structure; and
a fourth nanowire, wherein a first terminal of the fourth nanowire is electrically contacted with the second drain/source structure, and a second terminal of the fourth nanowire is electrically contacted with the third drain/source structure;
wherein the first gate structure further comprises a third gate dielectric layer, a central region of the third nanowire is surrounded by the third gate dielectric layer, the third gate dielectric layer is surrounded by the first gate layer, a first side region of the third nanowire is surrounded by the first spacer, and a second side region of the third nanowire is surrounded by the second spacer;
wherein the second gate structure further comprises a fourth gate dielectric layer, a central region of the fourth nanowire is surrounded by the fourth gate dielectric layer, the fourth gate dielectric layer is surrounded by the second gate layer, a first side region of the fourth nanowire is surrounded by the third spacer, and a second side region of the fourth nanowire is surrounded by the fourth spacer.

8. The antifuse-type one time programming memory cell as claimed in claim 7, wherein when a program action is performed, the bit line receives a ground voltage, the word line receives an on voltage, and the antifuse control line receives a program voltage, wherein when the program action is performed, one of the second gate dielectric layer and the fourth gate dielectric layer is ruptured, so that the antifuse-type one time programming memory cell is programmed to a low-resistance storage state.

9. The antifuse-type one time programming memory cell as claimed in claim 7, wherein when a read action is performed, the bit line receives a ground voltage, the word line receives an on voltage, and the antifuse control line receives a read voltage, so that the antifuse-type one time programming memory cell generates a read current, wherein a storage state of the antifuse-type one time programming memory cell is determined according to a magnitude of the read current.

10. The antifuse-type one time programming memory cell as claimed in claim 7, further comprising:
a fifth nanowire, wherein a first terminal of the fifth nanowire is electrically contacted with the third drain/source structure;
a sixth nanowire, wherein a first terminal of the sixth nanowire is electrically contacted with the third drain/source structure;
a third gate structure comprising a fifth spacer, a sixth spacer, a fifth gate dielectric layer, a sixth gate dielectric layer and a third gate layer, wherein a central region of the fifth nanowire is surrounded by the fifth gate dielectric layer, the fifth gate dielectric layer is surrounded by the third gate layer, a central region of the sixth nanowire is surrounded by the sixth gate dielectric layer, the sixth gate dielectric layer is surrounded by the third gate layer, the third gate layer is located over the isolation layer, a first side region of the fifth nanowire is surrounded by the fifth spacer, a second side region of the fifth nanowire is surrounded by the sixth spacer, a first side region of the sixth nanowire is surrounded by the fifth spacer, a second side region of the sixth nanowire is surrounded by the sixth spacer, and the fifth spacer and the sixth spacer are located over the semiconductor substrate; and
a fourth drain/source structure formed over the isolation layer, electrically contacted with a second terminal of the fifth nanowire, and electrically contacted with a second terminal of the sixth nanowire;
wherein the fifth nanowire, the sixth nanowire, the third gate structure, the third drain/source structure and the fourth drain/source structure are collaboratively formed as a second select transistor;
wherein the second select transistor is the gate-all-around transistor, the fourth drain/source structure is connected with the bit line, and the third gate layer of the third gate structure is connected with the word line.

11. An antifuse-type one time programming memory cell, comprising:
a semiconductor substrate;
an isolation layer formed on a surface of the semiconductor substrate;
a first nanowire;
a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate;

a first drain/source structure formed over the isolation layer and electrically contacted with a first terminal of the first nanowire;
a second drain/source structure formed over the isolation layer and electrically contacted with a second terminal of the first nanowire; wherein the first nanowire, the first gate structure, the first drain/source structure and the second drain/source structure are collaboratively formed as a first select transistor;
a second nanowire, wherein a first terminal of the second nanowire is electrically contacted with the second drain/source structure;
a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate;
a third drain/source structure formed over the isolation layer and electrically contacted with a second terminal of the second nanowire; wherein the second nanowire, the second gate structure, the second drain/source structure and the third drain/source structure are collaboratively formed as a first following transistor;
a third nanowire, wherein a first terminal of the third nanowire is electrically contacted with the third drain/source structure;
a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is located over the isolation layer, a first side region of the third nanowire is surrounded by the fifth spacer, a second side region of the third nanowire is surrounded by the sixth spacer, and the fifth spacer and the sixth spacer are located over the semiconductor substrate; and
a fourth drain/source structure formed over the isolation layer and electrically contacted with a second terminal of the third nanowire; wherein the third nanowire, the third gate structure, the third drain/source structure and the fourth drain/source structure are collaboratively formed as an antifuse transistor;
wherein each of the first select transistor, the first following transistor and the antifuse transistor is a gate-all-around transistor, the first drain/source structure is connected with a bit line, the first gate layer of the first gate structure is connected with a word line, the second gate layer of the second gate structure is connected with a following line, and the third gate layer of the third gate structure is connected with an antifuse control line.

12. The antifuse-type one time programming memory cell as claimed in claim 11, wherein a thickness of the first gate dielectric layer is larger than a thickness of the third gate dielectric layer.

13. The antifuse-type one time programming memory cell as claimed in claim 11, wherein a cross section area of the third nanowire is smaller than a cross section area of the first nanowire.

14. The antifuse-type one time programming memory cell as claimed in claim 11, further comprising:

a fourth nanowire, wherein a first terminal of the fourth nanowire is electrically contacted with the fourth drain/source structure;
a fourth gate structure comprising a seventh spacer, an eighth spacer, a fourth gate dielectric layer and a fourth gate layer, wherein a central region of the fourth nanowire is surrounded by the fourth gate dielectric layer, the fourth gate dielectric layer is surrounded by the fourth gate layer, the fourth gate layer is located over the isolation layer, a first side region of the fourth nanowire is surrounded by the seventh spacer, a second side region of the fourth nanowire is surrounded by the eighth spacer, and the seventh spacer and the eighth spacer are located over the semiconductor substrate;
a fifth drain/source structure formed over the isolation layer and electrically contacted with a second terminal of the fourth nanowire; wherein the fourth nanowire, the fourth gate structure, the fourth drain/source structure and the fifth drain/source structure are collaboratively formed as a second following transistor;
a fifth nanowire, wherein a first terminal of the fifth nanowire is electrically contacted with the fifth drain/source structure;
a fifth gate structure comprising a ninth spacer, a tenth spacer, a fifth gate dielectric layer and a fifth gate layer, wherein a central region of the fifth nanowire is surrounded by the fifth gate dielectric layer, the fifth gate dielectric layer is surrounded by the fifth gate layer, the fifth gate layer is located over the isolation layer, a first side region of the fifth nanowire is surrounded by the ninth spacer, a second side region of the fifth nanowire is surrounded by the tenth spacer, and the ninth spacer and the tenth spacer are located over the semiconductor substrate; and
a sixth drain/source structure formed over the isolation layer and electrically contacted with a second terminal of the fifth nanowire; wherein the fifth nanowire, the fifth gate structure, the fifth drain/source structure and the sixth drain/source structure are collaboratively formed as a second select transistor;
wherein each of the second following transistor and the second select transistor is the gate-all-around transistor, the sixth drain/source structure is connected with the bit line, the fifth gate layer of the fifth gate structure is connected with the word line, and the fourth gate layer of the fourth gate structure is connected with the following line.

15. The antifuse-type one time programming memory cell as claimed in claim 11, further comprising:

a fourth nanowire, wherein a first terminal of the fourth nanowire is electrically contacted with the first drain/source structure, and a second terminal of the fourth nanowire is electrically contacted with the second drain/source structure;
a fifth nanowire, wherein a first terminal of the fifth nanowire is electrically contacted with the second drain/source structure, and a second terminal of the fifth nanowire is electrically contacted with the third drain/source structure; and
a sixth nanowire, wherein a first terminal of the sixth nanowire is electrically contacted with the third drain/source structure, and a second terminal of the sixth nanowire is electrically contacted with the fourth drain/source structure;
wherein the first gate structure further comprises a fourth gate dielectric layer, a central region of the fourth nanowire is surrounded by the fourth gate dielectric layer, the fourth gate dielectric layer is surrounded by the first gate layer, a first side region of the fourth nanowire is surrounded by the first spacer, and a second side region of the fourth nanowire is surrounded by the second spacer;

wherein the second gate structure further comprises a fifth gate dielectric layer, a central region of the fifth nanowire is surrounded by the fifth gate dielectric layer, the fifth gate dielectric layer is surrounded by the second gate layer, a first side region of the fifth nanowire is surrounded by the third spacer, and a second side region of the fifth nanowire is surrounded by the fourth spacer;

wherein the third gate structure further comprises a sixth gate dielectric layer, a central region of the sixth nanowire is surrounded by the sixth gate dielectric layer, the sixth gate dielectric layer is surrounded by the third gate layer, a first side region of the sixth nanowire is surrounded by the fifth spacer, and a second side region of the sixth nanowire is surrounded by the sixth spacer.

16. The antifuse-type one time programming memory cell as claimed in claim 15, wherein when a program action is performed, the bit line receives a ground voltage, the word line receives a first on voltage, the following line receives a second on voltage, and the antifuse control line receives a program voltage, wherein when the program action is performed, one of the third gate dielectric layer and the sixth gate dielectric layer is ruptured, so that the antifuse-type one time programming memory cell is programmed to a low-resistance storage state.

17. The antifuse-type one time programming memory cell as claimed in claim 15, wherein when a read action is performed, the bit line receives a ground voltage, the word line receives a first on voltage, the following line receives a second on voltage, and the antifuse control line receives a read voltage, so that the antifuse-type one time programming memory cell generates a read current, wherein a storage state of the antifuse-type one time programming memory cell is determined according to a magnitude of the read current.

18. The antifuse-type one time programming memory cell as claimed in claim 15, further comprising:
a seventh nanowire, wherein a first terminal of the seventh nanowire is electrically contacted with the fourth drain/source structure;
an eighth nanowire, wherein a first terminal of the eighth nanowire is electrically contacted with the fourth drain/source structure;
a fourth gate structure comprising a seventh spacer, an eighth spacer, a seventh gate dielectric layer, an eighth gate dielectric layer and a fourth gate layer, wherein a central region of the seven nanowire is surrounded by the seventh gate dielectric layer, a central region of the eighth nanowire is surrounded by the eighth gate dielectric layer, the seventh gate dielectric layer and the eighth gate dielectric layer are surrounded by the fourth gate layer, the fourth gate layer is located over the isolation layer, a first side region of the seventh nanowire is surrounded by the seventh spacer, a second side region of the seventh nanowire is surrounded by the eighth spacer, a first side region of the eighth nanowire is surrounded by the seventh spacer, a second side region of the eighth nanowire is surrounded by the eighth spacer, and the seventh spacer and the eighth spacer are located over the semiconductor substrate;
a fifth drain/source structure formed over the isolation layer, electrically contacted with a second terminal of the seventh nanowire, and electrically contacted with a second terminal of the eighth nanowire; wherein the seventh nanowire, the eighth nanowire, the fourth gate structure, the fourth drain/source structure and the fifth drain/source structure are collaboratively formed as a second following transistor;
a ninth nanowire, wherein a first terminal of the ninth nanowire is electrically contacted with the fifth drain/source structure;
a tenth nanowire, wherein a first terminal of the tenth nanowire is electrically contacted with the fifth drain/source structure;
a fifth gate structure comprising a ninth spacer, a tenth spacer, a ninth gate dielectric layer, a tenth gate dielectric layer and a fifth gate layer, wherein a central region of the ninth nanowire is surrounded by the ninth gate dielectric layer, a central region of the tenth nanowire is surrounded by the tenth gate dielectric layer, the ninth gate dielectric layer and the tenth gate dielectric layer are surrounded by the fifth gate layer, the fifth gate layer is located over the isolation layer, a first side region of the ninth nanowire is surrounded by the ninth spacer, a second side region of the ninth nanowire is surrounded by the tenth spacer, a first side region of the tenth nanowire is surrounded by the ninth spacer, a second side region of the tenth nanowire is surrounded by the tenth spacer, and the ninth spacer and the tenth spacer are located over the semiconductor substrate;
a sixth drain/source structure formed over the isolation layer, electrically contacted with a second terminal of the ninth nanowire, and electrically contacted with a second terminal of the tenth nanowire; wherein the ninth nanowire, the tenth nanowire, the fifth gate structure, the fifth drain/source structure and the sixth drain/source structure are collaboratively formed as a second select transistor;
wherein each of the second following transistor and the second select transistor is the gate-all-around transistor, the sixth drain/source structure is connected with the bit line, the fifth gate layer of the fifth gate structure is connected with the word line, and the fourth gate layer of the fourth gate structure is connected with the following line.

19. An antifuse-type one time programming memory cell, comprising:
a semiconductor substrate;
an isolation layer formed on a surface of the semiconductor substrate;
a first nanowire;
a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate;
a first drain/source structure formed over the isolation layer and electrically contacted with a first terminal of the first nanowire;
a second drain/source structure formed over the isolation layer and electrically contacted with a second terminal of the first nanowire; wherein the first nanowire, the first gate structure, the first drain/source structure and the second drain/source structure are collaboratively formed as a first transistor;

a second nanowire, wherein a first terminal of the second nanowire is electrically contacted with the second drain/source structure;

a second gate structure comprising a third spacer, a fourth spacer, a second gate dielectric layer and a second gate layer, wherein a central region of the second nanowire is surrounded by the second gate dielectric layer, the second gate dielectric layer is surrounded by the second gate layer, the second gate layer is located over the isolation layer, a first side region of the second nanowire is surrounded by the third spacer, a second side region of the second nanowire is surrounded by the fourth spacer, and the third spacer and the fourth spacer are located over the semiconductor substrate;

a third drain/source structure formed over the isolation layer and electrically contacted with a second terminal of the second nanowire; wherein the second nanowire, the second gate structure, the second drain/source structure and the third drain/source structure are collaboratively formed as a second transistor;

a third nanowire, wherein a first terminal of the third nanowire is electrically contacted with the third drain/source structure;

a third gate structure comprising a fifth spacer, a sixth spacer, a third gate dielectric layer and a third gate layer, wherein a central region of the third nanowire is surrounded by the third gate dielectric layer, the third gate dielectric layer is surrounded by the third gate layer, the third gate layer is located over the isolation layer, a first side region of the third nanowire is surrounded by the fifth spacer, a second side region of the third nanowire is surrounded by the sixth spacer, and the fifth spacer and the sixth spacer are located over the semiconductor substrate; and a fourth drain/source structure formed over the isolation layer and electrically contacted with a second terminal of the third nanowire; wherein the third nanowire, the third gate structure, the third drain/source structure and the fourth drain/source structure are collaboratively formed as a third transistor;

a fourth nanowire, wherein a first terminal of the fourth nanowire is electrically contacted with the fourth drain/source structure;

a fourth gate structure comprising a seventh spacer, an eighth spacer, a fourth gate dielectric layer and a fourth gate layer, wherein a central region of the fourth nanowire is surrounded by the fourth gate dielectric layer, the fourth gate dielectric layer is surrounded by the fourth gate layer, the fourth gate layer is located over the isolation layer, a first side region of the fourth nanowire is surrounded by the seventh spacer, a second side region of the fourth nanowire is surrounded by the eighth spacer, and the seventh spacer and the eighth spacer are located over the semiconductor substrate; and a fifth drain/source structure formed over the isolation layer and electrically contacted with a second terminal of the fourth nanowire; wherein the fourth nanowire, the fourth gate structure, the fourth drain/source structure and the fifth drain/source structure are collaboratively formed as an antifuse transistor;

wherein each of the first transistor, the second transistor, the third transistor and the antifuse transistor is a gate-all-around transistor.

20. The antifuse-type one time programming memory cell as claimed in claim 19, further comprising:

a fifth nanowire, wherein a first terminal of the fifth nanowire is electrically contacted with the first drain/source structure, and a second terminal of the fifth nanowire is electrically contacted with the second drain/source structure; and a sixth nanowire, wherein a first terminal of the sixth nanowire is electrically contacted with the second drain/source structure, and a second terminal of the sixth nanowire is electrically contacted with the third drain/source structure;

a seventh nanowire, wherein a first terminal of the seventh nanowire is electrically contacted with the third drain/source structure, and a second terminal of the seventh nanowire is electrically contacted with the fourth drain/source structure; and an eighth nanowire, wherein a first terminal of the eighth nanowire is electrically contacted with the fourth drain/source structure, and a second terminal of the eighth nanowire is electrically contacted with the fifth drain/source structure;

wherein the first gate structure further comprises a fifth gate dielectric layer, a central region of the fifth nanowire is surrounded by the fifth gate dielectric layer, the fifth gate dielectric layer is surrounded by the first gate layer, a first side region of the fifth nanowire is surrounded by the first spacer, and a second side region of the fifth nanowire is surrounded by the second spacer;

wherein the second gate structure further comprises a sixth gate dielectric layer, a central region of the sixth nanowire is surrounded by the sixth gate dielectric layer, the sixth gate dielectric layer is surrounded by the second gate layer, a first side region of the sixth nanowire is surrounded by the third spacer, and a second side region of the sixth nanowire is surrounded by the fourth spacer;

wherein the third gate structure further comprises a seventh gate dielectric layer, a central region of the seventh nanowire is surrounded by the seventh gate dielectric layer, the seventh gate dielectric layer is surrounded by the third gate layer, a first side region of the seventh nanowire is surrounded by the fifth spacer, and a second side region of the seventh nanowire is surrounded by the sixth spacer;

wherein the fourth gate structure further comprises an eighth gate dielectric layer, a central region of the eighth nanowire is surrounded by the eighth gate dielectric layer, the eighth gate dielectric layer is surrounded by the fourth gate layer, a first side region of the eighth nanowire is surrounded by the seventh spacer, and a second side region of the eighth nanowire is surrounded by the eighth spacer.

21. The antifuse-type one time programming memory cell as claimed in claim 20, wherein the first transistor is a first select transistor, the second transistor is a second select transistor, and the third transistor is a following transistor, wherein the first drain/source structure is connected with a bit line, the first gate layer of the first gate structure is connected with a word line, the second gate layer of the second gate structure is connected with the word line, the third gate layer of the third gate structure is connected with a following line, and the fourth gate layer of the fourth gate structure is connected with an antifuse control line.

22. The antifuse-type one time programming memory cell as claimed in claim 20, wherein the first transistor is a select transistor, the second transistor is a first following transistor, and the third transistor is a second following transistor, wherein the first drain/source structure is connected with a bit line, the first gate layer of the first gate structure is connected with a word line, the second gate layer of the second gate structure is connected with a first following line, the third gate layer of the third gate structure is connected with a second following line, and the fourth gate layer of the fourth gate structure is connected with an antifuse control line.

23. An antifuse-type one time programming memory cell, comprising:
   a semiconductor substrate;
   an isolation layer formed on a surface of the semiconductor substrate;
   a first nanowire;
   a first gate structure comprising a first spacer, a second spacer, a first gate dielectric layer and a first gate layer, wherein a central region of the first nanowire is surrounded by the first gate dielectric layer, the first gate dielectric layer is surrounded by the first gate layer, the first gate layer is located over the isolation layer, a first side region of the first nanowire is surrounded by the first spacer, a second side region of the first nanowire is surrounded by the second spacer, and the first spacer and the second spacer are located over the semiconductor substrate;
   a first drain/source structure formed over the isolation layer and electrically contacted with a first terminal of the first nanowire;
   a second drain/source structure formed over the isolation layer and electrically contacted with a second terminal of the first nanowire;
   wherein the first nanowire, the first gate structure, the first drain/source structure and the second drain/source structure are collaboratively formed as an antifuse select transistor; and the first drain/source structure, the second drain/source structure, and the first nanowire have the same dopant type;
   wherein the antifuse transistor is a storage element of the antifuse-type one time programming memory cell, and the antifuse transistor is a gate-all-around transistor;
   wherein when a program action is performed, the first gate dielectric layer is ruptured, so that the antifuse-type one time programming memory cell is programmed to a low-resistance storage state.

24. The antifuse-type one time programming memory cell as claimed in claim 23, further comprising:
   a second nanowire, wherein a first terminal of the second nanowire is electrically contacted with the first drain/source structure; a second terminal of the second nanowire is electrically contacted with the second drain/source structure; and the second nanowire and the first nanowire have the same dopant type;
   wherein the first gate structure further comprises a second gate dielectric layer, a central region of the second nanowire is surrounded by the second gate dielectric layer, the second gate dielectric layer is surrounded by the first gate layer, a first side region of the second nanowire is surrounded by the first spacer, and a second side region of the second nanowire is surrounded by the second spacer.

25. The antifuse-type one time programming memory cell as claimed in claim 24, further comprising a select transistor, wherein a first drain/source terminal of the select transistor is connected with a bit line, a gate terminal of the select transistor is connected with a word line, a second drain/source terminal of the select transistor is connected with the first drain/source structure, and the gate layer of the gate structure is connected with an antifuse control line.

* * * * *